(12) United States Patent
Sakakibara

(10) Patent No.: US 9,075,089 B2
(45) Date of Patent: Jul. 7, 2015

(54) METHOD OF MEASURING LINK VOLTAGE

(75) Inventor: Kenichi Sakakibara, Kusatsu (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 304 days.

(21) Appl. No.: 13/822,579

(22) PCT Filed: Sep. 26, 2011

(86) PCT No.: PCT/JP2011/071869
§ 371 (c)(1),
(2), (4) Date: Mar. 12, 2013

(87) PCT Pub. No.: WO2012/043465
PCT Pub. Date: Apr. 5, 2012

(65) Prior Publication Data
US 2013/0181695 A1    Jul. 18, 2013

(30) Foreign Application Priority Data

Sep. 30, 2010  (JP) ................................ 2010-221543

(51) Int. Cl.
| | |
|---|---|
| *G01R 19/00* | (2006.01) |
| *H02M 1/44* | (2007.01) |
| *H02M 7/797* | (2006.01) |
| *H02M 5/458* | (2006.01) |
| *G01R 19/25* | (2006.01) |

(52) U.S. Cl.
CPC .......... *G01R 19/0084* (2013.01); *H02M 5/4585* (2013.01); *H02M 1/44* (2013.01); *H02M 7/797* (2013.01); *G01R 19/2513* (2013.01)

(58) Field of Classification Search
CPC ..... H02M 1/44; H02M 7/797; H02M 5/4585; G01R 19/0084; G01R 19/2513

USPC ................................................ 363/37, 52, 88
See application file for complete search history.

(56) References Cited

U.S. PATENT DOCUMENTS

| | | |
|---|---|---|
| 7,907,427 B2 | 3/2011 | Sakakibara et al. |
| 7,944,717 B2 | 5/2011 | Sakakibara |

(Continued)

FOREIGN PATENT DOCUMENTS

| | | | |
|---|---|---|---|
| JP | 2000-14200 A | 1/2000 | |
| JP | 2007-312589 A | 11/2007 | |

(Continued)

OTHER PUBLICATIONS

Wei et al., "A Novel Matrix Converter Topology With Simple Commutation", Department of Electrical and Computer Engineering, IEEE IAS 2001, vol. 3, pp. 1-6, 2001.

*Primary Examiner* — Jessica Han
(74) *Attorney, Agent, or Firm* — Birch, Stewart, Kolasch & Birch, LLP

(57) ABSTRACT

A cycle is divided into a first period and a second period. The first period is longer than the second period. Two sections in which a unit voltage vector is adopted in the first period are adopted as a first section and a second section. A first measured value of a link voltage is measured at a midpoint of the first section and a second measured value of the link voltage is measured at a midpoint of the second section. Then, a representative value of the link voltage in a cycle including the first period is obtained by interpolation of the first measured value and the second measured value. A maximum value of the link voltage is obtained by dividing the representative value by $\cos \theta$.

16 Claims, 16 Drawing Sheets

(56) References Cited

U.S. PATENT DOCUMENTS

| | | | |
|---|---|---|---|
| 8,093,746 B2 * | 1/2012 | Murali Dora et al. | 307/6 |
| 8,270,186 B2 | 9/2012 | Sakakibara | |
| 8,441,820 B2 * | 5/2013 | Shen et al. | 363/56.01 |
| 8,450,961 B2 * | 5/2013 | Sakakibara | 318/504 |
| 2010/0244570 A1 | 9/2010 | Sakakibara | |
| 2010/0308892 A1 | 12/2010 | Sakakibara | |

FOREIGN PATENT DOCUMENTS

| | | |
|---|---|---|
| JP | 4067021 B2 | 3/2008 |
| JP | 2009-106110 A | 5/2009 |
| JP | 2009-213252 A | 9/2009 |
| JP | 2010-98848 A | 4/2010 |
| KR | 10-2010-0051880 A | 5/2010 |

* cited by examiner

F I G. 5
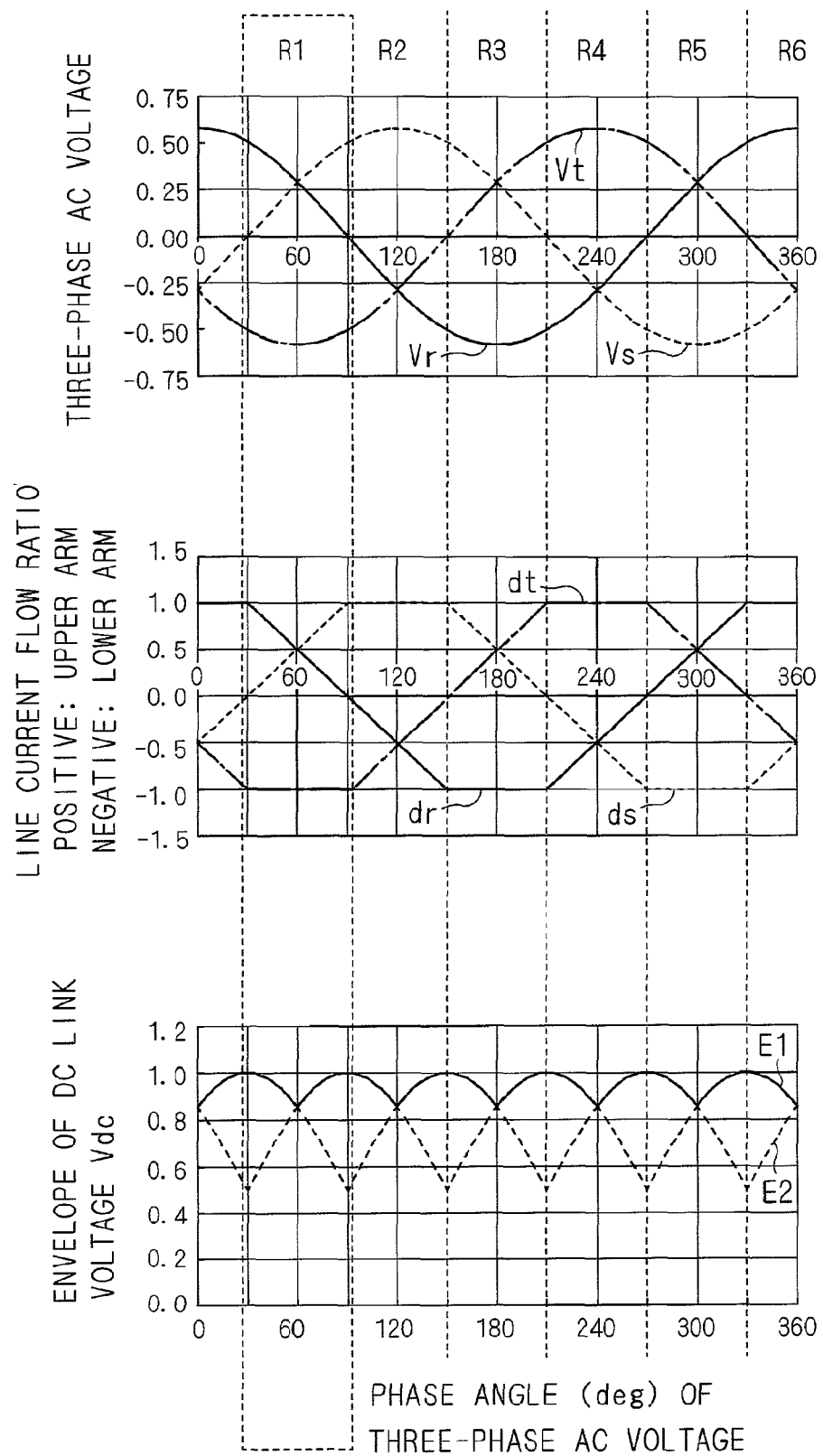

METHOD OF MEASURING LINK VOLTAGE

TECHNICAL FIELD

The present invention relates to a voltage measurement technique, and more particularly to a technique for measuring a voltage of a DC link which connects a current source converter and a voltage source inverter.

BACKGROUND ART

As a so-called direct AC-AC power converter circuit, an indirect matrix converter is well known. The indirect matrix converter comprises a current source converter for performing AC-DC conversion, a voltage source inverter for performing DC-AC conversion, and a DC link for connecting the current source converter and the voltage source inverter.

When the instantaneous space voltage vector modulation is adopted in order to control the voltage source inverter, the modulation factor is applied as a ratio of a line voltage peak value of an AC voltage outputted from the voltage source inverter to a DC voltage inputted to the voltage source inverter.

Japanese Patent Application Laid Open Gazette No. 2000-14200, for example, discloses a technique for obtaining a modulation factor by polar coordinate conversion of a so-called d-axis voltage command and a q-axis voltage command.

In the indirect matrix converter, a voltage (hereinafter, referred to as "link voltage") applied to a DC link from the current source converter is a DC voltage inputted to the voltage source inverter. Since the indirect matrix converter is a direct AC-AC power converter circuit, however, the indirect matrix converter has the DC link but the DC link does not substantially comprise a smoothing circuit.

Therefore, the DC voltage inputted to the voltage source inverter largely varies with the switching of the current source converter. It is not preferable in terms of accuracy that the modulation factor is obtained without consideration of this variation.

Considering this background, in the field of the direct AC-AC power converter circuit, proposed are the techniques disclosed in Japanese Patent Application Laid Open Gazette Nos. 2009-213252 and 2010-98848.

Japanese Patent Application Laid Open Gazette No. 2009-213252 discloses a technique for detecting an instantaneous value of a DC voltage on the basis of a switching pattern of the current source converter.

Japanese Patent Application Laid Open Gazette No. 2010-98848 discloses a technique for obtaining a DC voltage by using an average value of a first average DC voltage which is obtained by averaging a link voltage in a switching cycle of the current source converter in a section which corresponds to one twelfth of the cycle of an AC voltage inputted to the current source converter.

Other than the above documents, among those discussed below are Japanese Patent Application Laid Open Gazette No. 2007-312589, Japanese Patent Publication No. 4067021, Japanese Patent Application Laid Open Gazette No. 2009-106110 and L. Wei, T. A. Lipo, "A Novel Matrix Converter Topology with Simple Commutation, IEEE ISA2001, vo. 3, pp. 1749-1754, 2001.

SUMMARY OF THE INVENTION

Problems to be Solved by the Invention

In the technique disclosed in Japanese Patent Application Laid Open Gazette No. 2010-98848, though the DC voltage is less susceptible to the effect of a switching noise since a complicated averaging is performed, the responsiveness to a power supply voltage variation decreases.

In the technique disclosed in Japanese Patent Application Laid Open Gazette No. 2009-213252, though the responsiveness is excellent, since the switching timing of the voltage source inverter is not taken into consideration, the DC voltage is susceptible to the effect of a noise caused by the switching (switching noise).

Therefore, it is an object of the present invention to provide a technique for measuring a link voltage with the resistance to switching noise and the responsiveness increased.

Means for Solving the Problems

A first aspect of the present invention is a method of measuring a link voltage performed in a direct AC-AC power converter circuit.

The direct AC-AC power converter circuit includes a DC link (3) to which the link voltage (Vdc) is applied, a current source converter (1), and a voltage source inverter (2).

The current source converter (1) has three input terminals (Pr, Ps, Pt) for receiving three-phase AC voltages (Vr, Vs, Vt) by phase, and commutates current supplied from the input terminals at a cycle (T0) which is divided into a first period (drt·T0) and a second period (dst·T0) to apply the link voltage which is a DC voltage to the DC link.

The first period is a period in which the DC link is supplied with current flowing into a first pair (Pr, Pt) out of the three input terminals, to which a voltage of maximum phase and a voltage of minimum phase among the three-phase AC voltages are applied.

The second period is a period in which the DC link is supplied with current flowing into a second pair (Ps, Pt) out of the three input terminals, to which a voltage of intermediate phase and the voltage of the minimum phase among the three-phase AC voltages are applied.

The voltage source inverter (2) performs switching on the link voltage with a switching pattern based on pulse width modulation to output multiphase alternating current.

The method comprises the steps of (a) measuring a first measured value (Vmax1) which is the link voltage measured at a midpoint of a first section in which only a first switching pattern is adopted for the longest time in the first period, (b) measuring a second measured value (Vmax2) which is the link voltage measured at a midpoint of a second section in which only a single switching pattern is adopted for a time as long as the first section or for the second longest time next to the first section in the first period, and (c) obtaining a representative value (Vmax) of the link voltage in one cycle including the first period by interpolation of the first measured value and the second measured value.

According to a second aspect of the present invention, in the method of measuring a link voltage of the first aspect of the present invention, the first period (drt·T0) is longer than the second period (dst·T0).

According to a third aspect of the present invention, in the method of measuring a link voltage of the first or second aspect of the present invention, the method further comprises (d) adopting the first measured value as the representative value of the link voltage in the cycle including the first period, instead of the steps (b) and (c), in a case where a section in which only a second switching pattern different from the first switching pattern is adopted is provided both before and after the first section.

According to a fourth aspect of the present invention, in the method of measuring a link voltage of the first aspect or the second aspect of the present invention, the switching pattern is determined on the basis of a result of comparison between a carrier having a triangular wave whose inclinations have the same absolute value and a signal wave taking a constant value in the first period. When the switching pattern adopted in the first section and the switching pattern adopted in the second section are identical to each other, an arithmetic mean is adopted as the interpolation in the step (c).

According to a fifth aspect of the present invention, in the method of measuring a link voltage of the fourth aspect of the present invention, a timing for measuring the first measured value and a timing for measuring the second measured value are determined by a timing at which the carrier takes a single predetermined value.

According to a sixth aspect of the present invention, in the method of measuring a link voltage of any one of the first to fifth aspects of the present invention, assuming that a phase (θ) for a cycle of the three-phase AC voltages at a point in time when two voltages out of the three-phase AC voltages are equal to each other is π/3, a maximum value of the link voltage is obtained by dividing the representative value of the link voltage in a section in which the phase ranges from −π/6 to π/6 by a cosine value of the phase.

Effects of the Invention

In the method of measuring a link voltage of the first aspect of the present invention, since the link voltage is measured at a timing far from a switching timing of the inverter, the measured link voltage is less susceptible to the switching noise of the inverter. Further, since no complicated averaging is performed on the measured link voltage, excellent responsiveness is achieved. Moreover, even if a filter circuit is provided on the input side of the current source converter, and if the three-phase voltages to be supplied to the input terminals vary due to the filter circuit, it is possible to obtain the representative value of the link voltage without the effect. The representative value contributes to a control of an output voltage of the voltage source inverter by using the modulation factor.

In the method of measuring a link voltage of the second aspect of the present invention, since a conduction ratio of the current flowing in the maximum phase to the current flowing in the intermediate phase is increased in the current source converter, the current inputted to the direct AC-AC power converter circuit becomes approximate to a sine wave.

By the method of measuring a link voltage of the third to fifth aspects of the present invention, it is possible to more easily obtain the representative value of the link voltage.

In the method of measuring a link voltage of the sixth aspect of the present invention, since the maximum value of the link voltage is obtained, it is possible to more easily control the output voltage of the voltage source inverter by using the modulation factor.

These and other objects, features, aspects and advantages of the present invention will become more apparent from the following detailed description of the present invention when taken in conjunction with the accompanying drawings.

BRIEF DESCRIPTION OF DRAWINGS

FIG. 5 shows graphs for explanation on an operation of a current source converter;

EMBODIMENT FOR CARRYING OUT THE INVENTION

Figure 1:
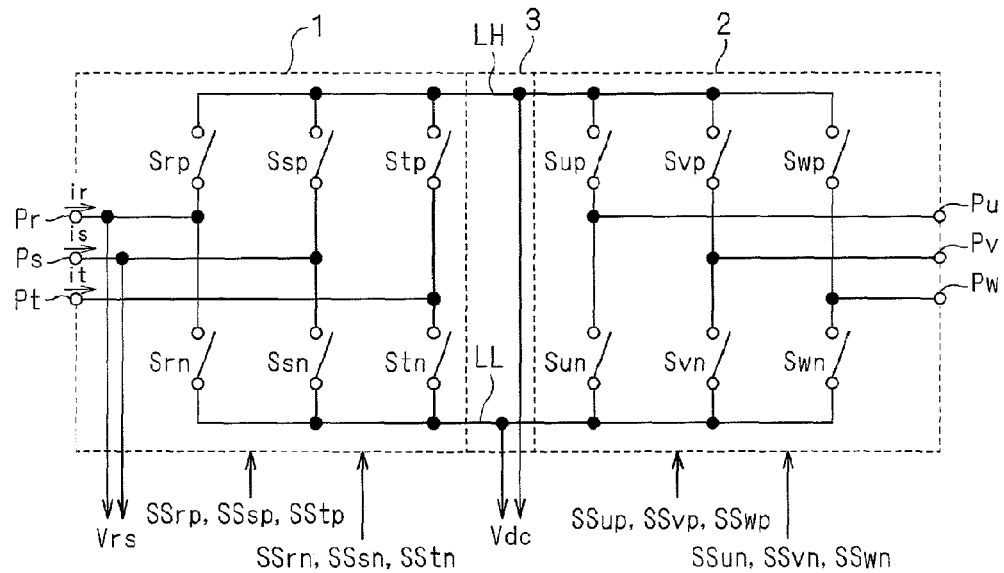
FIG. 1 is a circuit diagram showing an example of conceptual configuration of a direct AC-AC power converter to which the present invention can be applied

FIG. 1 is a circuit diagram showing an example of conceptual configuration of a direct AC-AC power converter. The direct AC-AC power converter comprises a current source converter 1, a voltage source inverter 2, and a DC link 3.

The current source converter 1 has three input terminals Pr, Ps, and Pt. The input terminals Pr, Ps, and Pt are connected to, for example, a three-phase AC power supply and receives three-phase AC voltages by phase. The current source converter 1 commutates line currents ir, is, and it supplied from the input terminals Pr, Ps, and Pt at a cycle which is divided into a first period and a second period, to thereby apply a link voltage Vdc to the DC link 3.

The first period is a period in which the DC link 3 is supplied with current flowing into one pair out of the input terminals Pr, Ps, and Pt to which an AC voltage of maximum phase and an AC voltage of minimum phase are applied. The second period is a period in which the DC link 3 is supplied with current flowing into another one pair out of the input terminals Pr, Ps, and Pt to which an AC voltage of intermediate phase and the AC voltage of minimum phase are applied.

The DC link 3 has DC power supply lines LH and LL. By applying the link voltage Vdc, the DC power supply line LH has a potential higher than that of the DC power supply line LL. In the following discussion, a direction of the line currents ir, is, and it from the input terminals Pr, Ps, and Pt toward the voltage source inverter 2 is a positive direction.

The voltage source inverter 2 has output terminals Pu, Pv, and Pw. The voltage source inverter 2 performs switching on the link voltage Vdc with a switching pattern based on pulse width modulation, to thereby output multiphase alternating current to the output terminals Pu, Pv, and Pw.

Figure 2:
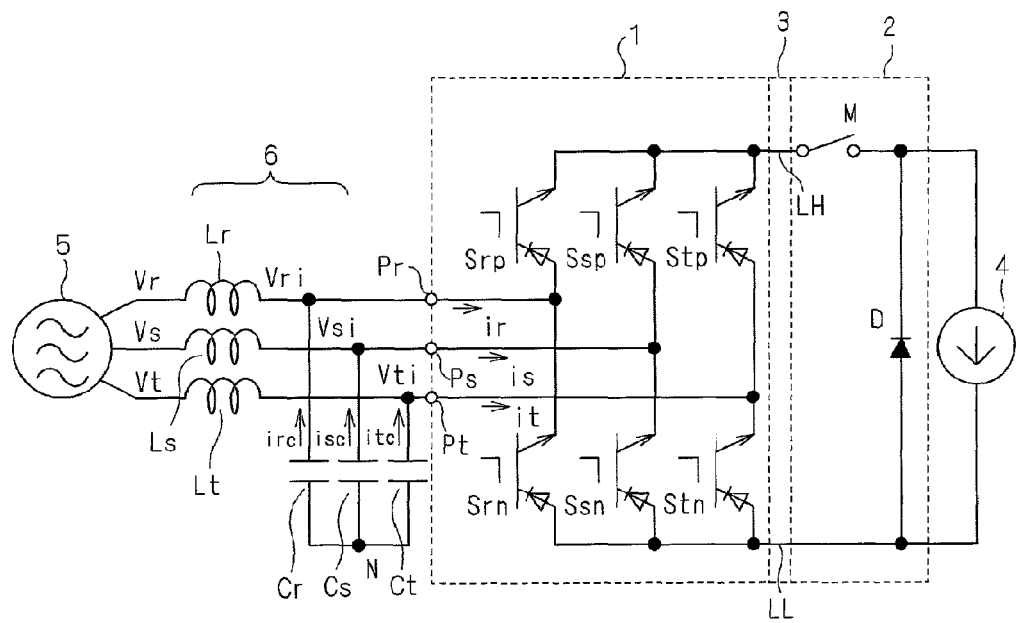
FIG. 2 is a circuit diagram showing an exemplary connection of the direct AC-AC power converter to a load and a three-phase AC power supply

FIG. 2 is a circuit diagram showing an exemplary connection of the direct AC-AC power converter to a load 4 and a three-phase AC power supply 5. In FIG. 2, the configuration of the current source converter 1 is shown in more detail than in FIG. 1 and the voltage source inverter 2 is represented by an equivalent circuit more simply than in FIG. 1.

Though the load 4 is equivalently represented as a current source in FIG. 2, the load 4 is actually a load connected to the output terminals Pu, Pv, and Pw, such as a inductive load (a three-phase motor or the like). The voltage source inverter 2 and the load 4 are each simplifiedly represented as a one-phase element. The voltage source inverter 2 is equivalently represented, consisting of a switch M provided on the DC power supply line LH and a diode D connected to the DC link 3 through the switch M. Herein, an anode and a cathode of the diode D are disposed on the sides of the DC power supply lines LL and LH, respectively.

The three-phase AC power supply 5 outputs the three-phase AC voltages Vr, Vs and Vt and is connected to the current source converter 1 through, e.g., a three-phase filter 6. The three-phase filter 6 has inductors Lr, Ls, and Lt and capacitors Cr, Cs, and Ct both of which are provided by phase, forming a low-pass filter. One end of each of the capacitors Cr, Cs, and Ct is connected to a node N. Since the filter provided to the current source converter 1 is well known (see, for example, Japanese Patent Application Laid Open Gazette No. 2009-213252), more detailed description on the configuration will be omitted.

The current source converter 1 comprises switching elements Sxp and Sxn ("x" represents "r", "s", and "t", and the same applies to the following). The switching element Sxp is provided between the input terminal Px and the DC power supply line LH. The switching element Sxn is provided between the input terminal Px and the DC power supply line LL.

The switching elements Sxp and Sxn each have reverse blocking capability and these elements are each illustrated as a reverse blocking IGBT (reverse blocking insulated gate bipolar transistor) in FIG. 2. Alternatively, these switching elements can be achieved by series connection of an insulated gate bipolar transistor and a diode.

Figure 3:
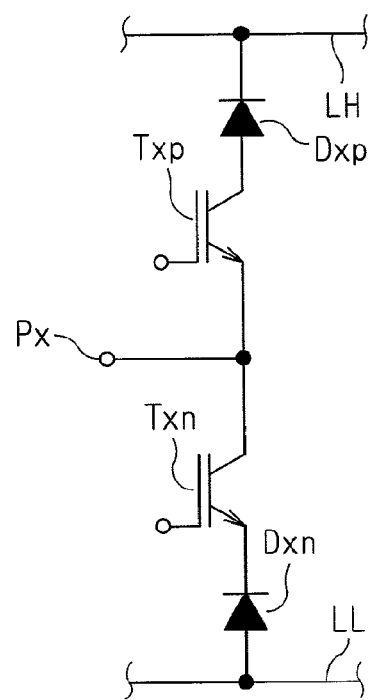
FIG. 3 is a circuit diagram showing exemplary switching elements

FIG. 3 shows exemplary switching elements Sxp and Sxn. The switching element Sxp comprises a transistor Txp and a diode Dxp. The diode Dxp is connected in series to the transistor Txp with its anode disposed on the side of the DC power supply line LL and its cathode disposed on the side of the DC power supply line LH. The switching element Sxn comprises a transistor Txn and a diode Dxn. The diode Dxn is connected in series to the transistor Txn with its anode disposed on the side of the DC power supply line LL and its cathode disposed on the side of the DC power supply line LH. As the transistors Txp and Txn, for example, insulated gate bipolar transistors are adopted.

To the switching elements Srp, Sm, Ssp, Ssn, Stp, and Stn, inputted are switching signals SSrp, SSrn, SSsp, SSsn, SStp, and SStn, respectively. It is assumed herein that the switching element Sxp is brought into conduction/non-conduction in response to an active state/a non-active state of the switching signal SSxp and the switching element Sxn is brought into conduction/non-conduction in response to an active state/a non-active state of the switching signal SSxn. Generation of the switching signals SSrp, SSrn, SSsp, SSsn, SStp, and SStn will be discussed later.

The voltage source inverter 2 comprises switching elements Syp and Syn ("y" represents "u", "v", and "w", and the same applies to the following). The switching element Syp is provided between the output terminal Py and the DC power supply line LH. The switching element Syn is provided between the output terminal Py and the DC power supply line LL.

Figure 4:
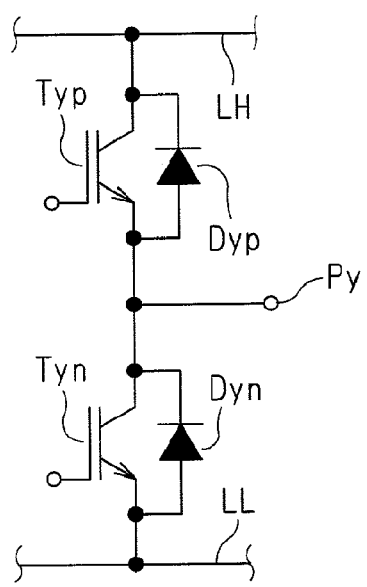
FIG. 4 is a circuit diagram showing another exemplary switching elements

FIG. 4 shows exemplary switching elements Syp and Syn. The switching element Syp comprises a transistor Typ and a diode Dyp. The diode Dyp is connected in parallel to the transistor Typ with its anode disposed on the side of the DC power supply line LL and its cathode disposed on the side of the DC power supply line LH. The switching element Syn comprises a transistor Tyn and a diode Dyn. The diode Dyn is connected in parallel to the transistor Tyn with its anode disposed on the side of the DC power supply line LL and its cathode disposed on the side of the DC power supply line LH.

As the transistors Typ and Tyn, for example, insulated gate bipolar transistors are adopted.

To the switching elements Sup, Sun, Svp, Svn, Swp, and Swn, inputted are switching signals SSup, SSun, SSvp, SSvn, SSwp, and SSwn, respectively. It is assumed herein that the switching element Syp is brought into conduction/non-conduction in response to an active state/a non-active state of the switching signal SSyp and the switching element Syn is brought into conduction/non-conduction in response to an active state/a non-active state of the switching signal SSyn.

FIG. 5 shows graphs for explanation on an operation of the current source converter 1. The upper-stage graph shows the three-phase AC voltages Vr, Vs, and Vt, the middle-stage graph shows conduction ratios dr, ds, and dt, and the lower-stage graph shows envelopes of the link voltage Vdc.

Above the upper-stage graph in FIG. 5, time areas R1 to R6 are added. The areas R1 to R6 are time-divided from each other at a timing when the voltage having the largest absolute value is switched among the three-phase AC voltages Vr, Vs, and Vt. This switching timing is also a timing when one of the three-phase AC voltages Vr, Vs, and Vt takes 0. Since the areas R1 to R6 are thus delimited, each of the areas has a length of π/3 obtained by dividing one cycle of each of the three-phase AC voltages Vr, Vs, and Vt by six. The area R1, for example, is an area in which the absolute value of the AC voltage Vt is larger than those of the AC voltages Vr and Vs, whose start of period is a point in time when the AC voltage Vs changes from negative to positive and end of period is a point in time when the AC voltage Vr changes from positive to negative.

The three-phase AC voltages Vr, Vs, and Vt are represented by a ratio to the maximum value of the line voltage, and therefore the maximum value of the absolute values of the three-phase AC voltages Vr, Vs, and Vt is $1/\sqrt{3}$. Herein, as a reference of phase angle (0°) of the three-phase AC voltages, adopted is a point in time when the AC voltage Vr takes the maximum value.

The conduction ratio dx represents a time ratio at which line current ix is flown by switching of the switching element Sxp or Sxn. When the conduction ratio dx is positive, the conduction ratio dx represents a time ratio at which the switching element Sxp is brought into conduction to flow current into the input terminal Px of the current source converter 1, and when the conduction ratio dx is negative, the conduction ratio dx represents a time ratio at which the switching element Sxn is brought into conduction to flow current out from the input terminal Px into the three-phase AC power supply 5. Specifically, for example, in the area R1, since the AC voltage Vt is the lowest, the switching element Stn continues to be in conduction and it is expressed that dt=−1. In this case, the switching elements Srp and Ssp are alternately brought into conduction and the respective time ratios at which the switching elements are brought into conduction are represented as the conduction ratios dr and ds. The switching elements Srp and Ssp are alternately brought into conduction with a cycle shorter than one cycle of the three-phase AC voltages Vr, Vs, and Vt, to thereby perform pulse width modulation.

As can be seen from FIG. 5, if the AC voltage Vr is higher than the AC voltage Vs in the area R1, the conduction ratio dr is higher than the conduction ratio ds, and if the AC voltage Vr is lower than the AC voltage Vs, the conduction ratio dr is lower than the conduction ratio ds. It is preferable that the conduction ratio of the line current corresponding to the AC voltage of maximum phase is made higher than the conduction ratio of the line current corresponding to of the AC voltage of intermediate phase in light of the line current ix being approximate to a sine wave. Since the technique for determining the conduction ratio dx with which the line current ix becomes sine-wave-like is well known (for example, L. Wei, T. A. Lipo, "A Novel Matrix Converter Topology with Simple Commutation, IEEE ISA2001, vol 3, pp 1749-1754, 2001 and Japanese Patent Application Laid Open Gazette Nos. 2009-213252 and 2007-312589, and the like), specific discussion on this technique will be omitted herein.

Among the voltages serving as an envelope of the link voltage Vdc, an upper envelope voltage E1 corresponds to a difference between the AC voltage of maximum phase and the AC voltage of minimum phase and a lower envelope voltage E2 corresponds to a difference between the AC voltage of intermediate phase and the AC voltage of minimum phase. The link voltage Vdc makes a transition between the upper envelope voltage E1 and the lower envelope voltage E2, depending on the switching of the switching elements Sxp and Sxn. This transition corresponds to a variation of the DC voltage inputted to the voltage source inverter discussed in Background Art.

The magnitude of the AC voltage is normalized with the magnitude of the line voltage and a point in time when the AC voltage of intermediate phase becomes 0 is assumed to be a reference of the phase θ. By adopting this reference, the phase θ at the point in time when two voltages out of the three-phase AC voltages become equal to each other is π/3 and the start of period and the end of period of each of the area R1 to R5 correspond to θ=0 and π/3, respectively. It is publicly known (for example, Japanese Patent Application Laid Open Gazette No. 2010-98848 and the like) that when the reference of the phase θ is adopted as above, the upper envelope voltage E1 in a section in which the phase θ ranges from −π/6 to π/6 is cos θ, i.e., the cosine value of the phase θ and the lower envelope voltage E2 is cos (θ−π/3).

In the area R1, for example, assuming that the phase θ at the point in time when the AC voltages Vr and Vs are equal to each other is π/3, in the first half where dr>ds, the upper envelope voltage E1 decreases from 1 to √3/2 and the lower envelope voltage E2 increases from 1/2 to √3/2 as the phase θ increases.

Thus, once the upper envelope voltage E1 and the phase θ are detected, the maximum value of the link voltage Vdc can be obtained. The phase θ can be obtained from the phases of the three-phase AC voltages Vr, Vs, and Vt. Therefore, only by obtaining a value of the upper envelope voltage E1 for each cycle in which the current source converter 1 commutates current, the maximum value of the link voltage Vdc can be quickly obtained by calculation of the cosine value and four arithmetic operations without performing averaging. When the maximum value of the link voltage Vdc is quickly obtained, it is possible to quickly control the voltage source inverter 2 with its modulation factor controlled.

Hereinafter, discussion will be made taken the area R1 as an example. In the area R1, since the conduction ratio dt is fixed to a value of −1, the conduction ratios dr and ds in the area R1 are expressed as drt and dst, respectively. Also in the other areas R2 to R6, from the symmetry of a phase voltage waveform, by appropriately changing the phase sequence and changing the switching elements Sxp and Sxn to each other, it is obvious that the following discussion applies to these areas.

Figure 6:
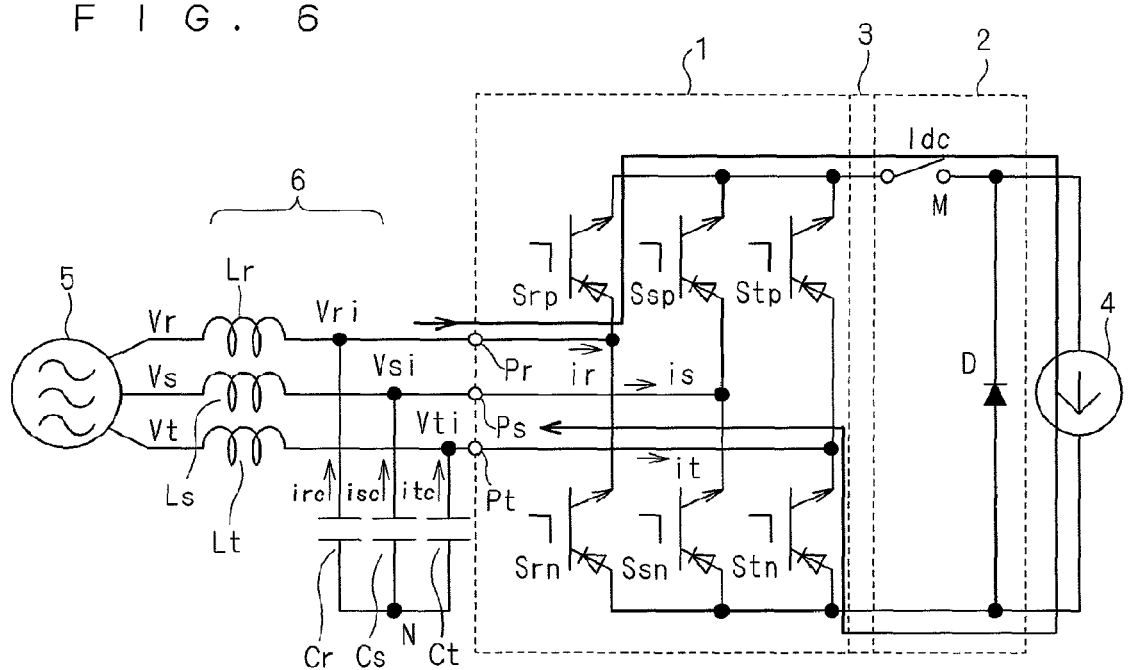
FIG. 6 is a circuit diagram showing current flowing between the direct AC-AC power converter and the load and the three-phase AC power supply.
Figure 7:
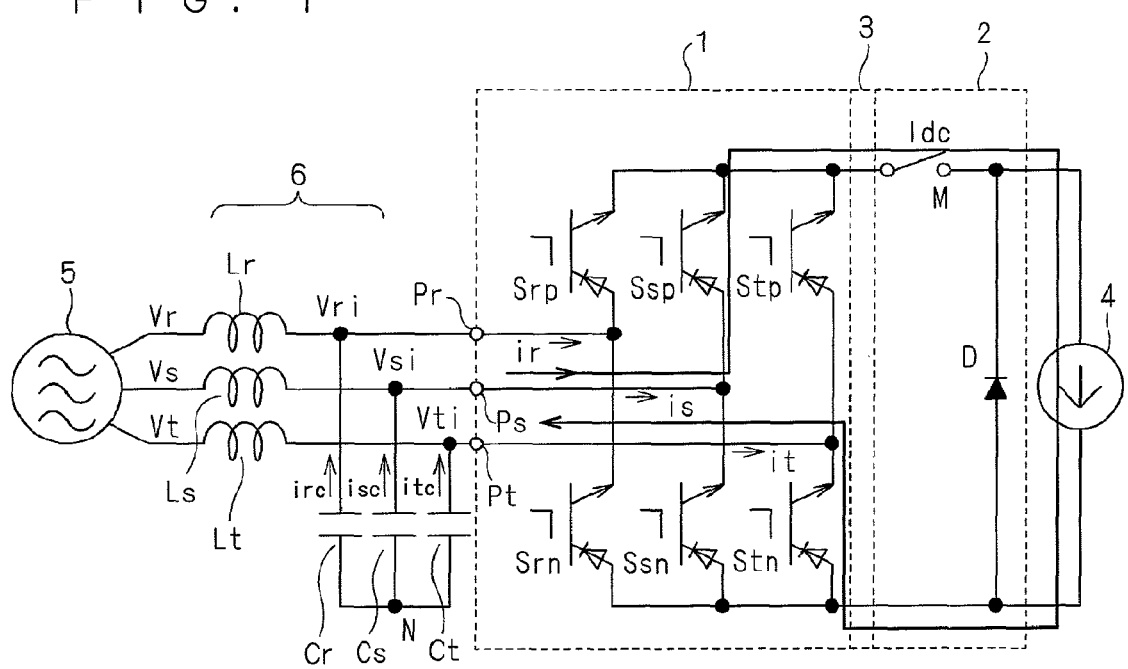
FIG. 7 is another circuit diagram showing current flowing between the direct AC-AC power converter and the load and the three-phase AC power supply.

FIGS. 6 and 7 each show current flowing between the direct AC-AC power converter and the load 4 and the three-phase AC power supply 5. FIG. 6 shows a case where the switching elements Srp and Stn are in conduction and the switching elements Ssp, Stp, Srn, and Ssn are not in conduction and a path of the link current Idc flowing in the DC link 3 correspondingly to the conduction ratio drt is indicated by a thick line. FIG. 7 shows a case where the switching elements Ssp and Stn are in conduction and the switching elements Srp, Stp, Srn, and Ssn are not in conduction and the path of the link current Idc flowing correspondingly to the conduction ratio dst is indicated by a thick line. For the link current Idc, a direction from the current source converter 1 toward the voltage source inverter 2 is the positive direction.

FIGS. 8 and 10 to 13 are graphs each showing an operation of the direct AC-AC power converter. In order to perform switching of the current source converter 1 in accordance with the above conduction ratios drt and dst, the carrier C1 having a triangular wave which makes a transition between the minimum value 0 and the maximum value 1 is adopted herein. Since dst+drt=1, by comparing the carrier C1 with the conduction ratio dst, the switching signals SSrp, SSrn, SSsp, and SSsn can be generated.

Specifically, when the carrier C1 is not lower than the conduction ratio dst, the switching signals SSsp and SSrp are made inactive and active, respectively. When the carrier C1 is lower than the conduction ratio dst, the switching signals SSsp and SSrp are made active and inactive, respectively. Though the switching signals SSsn and SSrn are not shown in FIGS. 8 and 10 to 13, the switching signals SSsn and SSrn have only to always take complementary logics of the switching signals SSsp and SSsr, respectively. In order to generate the switching signals SStp and SStn, for example, the carrier C1 may be compared with the value 0. When the carrier C1 is not lower than the value 0, the switching signals SStp and SStn are made inactive and active, respectively. The timing at which the current source converter 1 commutates the current is a point in time when the carrier C1 becomes equal to the conduction ratio dst.

When one cycle T0 of the carrier C1 is introduced, since the waveform of the carrier C1 is a triangular wave, the length of the period in which the carrier C1 is not lower than the conduction ratio dst is expressed as dst·T0 (hereinafter, this period is referred to also as "period dst·T0") and the length of the period in which the carrier C1 is lower than the conduction ratio dst is expressed as drt·T0 (hereinafter, this period is referred to also as "period drt·T0"). FIGS. 8 and 10 to 13 show a case where drt>dst, i.e., a case of the left half of the area R1 (see FIG. 5) where the phase angle is smaller. In this case, the AC voltages Vr, Vs, and Vt are the maximum phase, the intermediate phase, and the minimum phase, respectively. The periods drt·T0 and dst·T0 can be understood as the above-discussed first period and second period, respectively.

In the period dst·T0, the current flowing in a pair of the input terminals Ps and Pt among the input terminals Pr, Ps and Pt of the current source converter 1, to which the AC voltage Vs of intermediate phase and the AC voltage Vt of minimum phase are applied, is supplied to the DC link 3.

In the period drt·T0, the current flowing in a pair of the input terminals Pr and Pt among the input terminals Pr, Ps and Pt, to which the AC voltage Vr of maximum phase and the AC voltage Vt of minimum phase are applied, is supplied to the DC link 3.

Therefore, the potential of the DC power supply line LH almost has the AC voltage Vr in the period drt·T0 (the reference sign Vmax is added since this is of maximum phase) and almost has the AC voltage Vs in the period dst·T0 (the reference sign Vmid is added since this is of intermediate phase). Further, the AC voltage Vt (the reference sign Vmin is added since this is of minimum phase) is additionally shown and with this as a reference, the potential of the DC power supply line LH is represented as the link voltage Vdc. By detecting the link voltage Vdc in the period drt·T0, a voltage which corresponds to the upper envelope voltage E1 (FIG. 5) can be obtained.

As shown in FIGS. 8 and 10 to 13, however, there are some cases where the link voltage Vdc does not coincide with the line voltage in each of the periods drt·T0 and dst·T0. This is mainly caused by the filter 6.

It is assumed that for the currents irc, isc, and itc flowing in the capacitors Cr, Cs, and Ct, respectively, a direction toward the node N is the negative direction. When the currents irc, isc, and itc are positive, the capacitors Cr, Cs, and Ct are each discharged. When the currents irc, isc, and itc are negative, the capacitors Cr, Cs, and Ct are each charged.

The capacitor Cr is connected between the node N and the inductor Lr. The node of the capacitor Cr and the inductor Lr is connected to the input terminal Pr. Therefore, the potential of the input terminal Pr is a potential Vri obtained by subtracting the voltage drop at the inductor Lr from the AC voltage Vr in a case where the filter 6 is provided between the three-phase AC power supply 5 and the current source converter 1. Similarly, the capacitor Cs, the inductor Ls, and the input terminal Ps are connected to one another and the capacitor Ct, the inductor Lt, and the input terminal Pt are connected to one another. In the case where the filter 6 is provided between the three-phase AC power supply 5 and the current source converter 1, it is assumed that respective potentials of the input terminals Ps and Pt are potentials Vsi and Vti, respectively.

Figure 9:
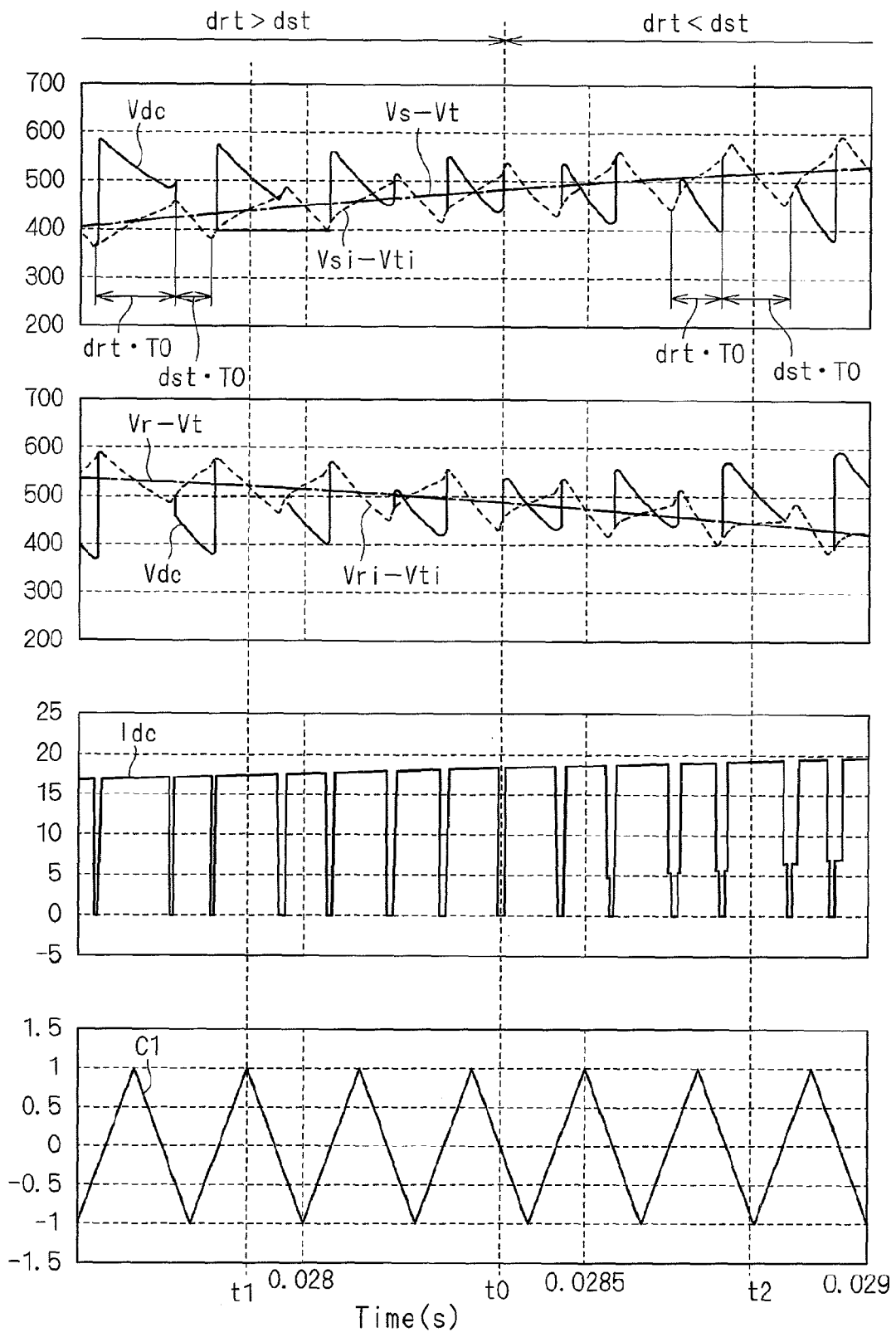

FIG. 9 shows graphs for explanation on an operation of the current source converter in the area R1. From the uppermost stage, the first-stage graph shows the link voltage Vdc and potential differences (Vs−Vt) and (Vsi−Vti), the second-stage graph shows the link voltage Vdc and potential differences (Vr−Vt) and (Vri−Vti), the third-stage graph shows the link current Idc, and the fourth-stage graph shows the carrier C1. The first to fourth-stage graphs have a common horizontal axis representing time.

Before the time t0, the AC voltages Vr and Vs correspond to the maximum phase and the intermediate phase, respectively, and this period corresponds to the period before the phase angle of 60° of the three-phase AC voltage with reference to FIG. 5. After the time t0, the AC voltages Vr and Vs correspond to the intermediate phase and the maximum phase, respectively, and this period corresponds to the period after the phase angle of 60° of the three-phase AC voltage with reference to FIG. 5. Therefore, in the control of the current source converter 1, the relation of drt>dst holds on the conduction ratios before the time t0 and the relation of drt<dst holds on the conduction ratios after the time t0.

For the purpose of reducing the switching loss at the timing when the current source converter 1 commutates the current or the like, the link current Idc is 0 in a short period including this timing. This can be achieved by adopting a zero voltage vector in the voltage source inverter 2 as discussed later, not by the control of the commutation in the current source converter 1.

As shown in FIG. 6, the link voltage Vdc coincides with the potential difference (Vri−Vti) in a case where the link current Idc flows between the input terminals Pr and Pt. At that time, the current irc flows in the positive direction and the capacitor Cr is discharged. With this discharge, the potential difference (Vri−Vti) decreases. At that time, since all the capacitor Cr, Cs, and Ct are connected to the node N, the three-phase equilibrium state is kept and the capacitor Cs is charged, to thereby increase the potential difference (Vsi−Vti).

On the other hand, as shown in FIG. 7, the link voltage Vdc coincides with the potential difference (Vsi−Vti) in a case where the link current Idc flows between the input terminals Ps and Pt. At that time, the capacitor Cs is discharged and the potential difference (Vsi−Vti) thereby decreases. At that time, the potential difference (Vri−Vti) increases.

Thus, though the link voltage Vdc does not take a constant value in the period drt·T0, since the discharge of the capacitor Cr is almost linear, it is desirable that the link voltage Vdc should be measured near the midpoint of the period drt·T0. In FIGS. 8 and 10 to 13, the measured link voltage Vdc is indicated by a blank circle. Since the measured link voltage Vdc indicates a voltage value of the AC voltage Vr of maximum phase in FIG. 8, the blank circle is represented as the reference sign "Vmax".

Though the link current Idc actually pulsates as discussed later, the link current Idc is represented by a simple rectangular wave in FIGS. 8 and 10 to 13.

In FIG. 9, at the time t1 (<t0), the carrier C1 takes a maximum value and the link voltage Vdc at that point in time is measured. At the time t2 (>t0), the carrier C1 takes a minimum value, and since drt<dst at that time, the potential difference (Vsi−Vti) coincides with the link voltage Vdc. Thus, when the carrier C1 has a symmetric triangular wave, the midpoint of the period drt·T0 can be set as a point in time when the carrier C1 takes the maximum value of 1 and the midpoint of the period dst·T0 can be set as a point in time when the carrier C1 takes the minimum value of 0. Herein, the symmetric triangular wave refers to a triangular wave whose inclinations have a constant absolute value.

Thus, in the case where the link voltage Vdc is measured at a timing based only on the carrier C1 which determines the timing at which the current source converter 1 commutates the current, since the switching of the voltage source inverter 2 is not taken into consideration, the noise caused by the switching sometimes has an effect on the measured link voltage Vdc.

Prior to discussion on the effect of the noise, brief discussion will be made on the switching of the voltage source inverter 2.

In order to perform an instantaneous space voltage vector modulation of the voltage source inverter 2, the carrier C2 is compared with a command value, and the switching signals SSup, SSun, SSvp, SSvn, SSwp, and SSwn are generated on the basis of the comparison result. For simple discussion, as the carrier C2, a carrier having the same phase and the same form as those of the carrier C1 is adopted. As a matter of course, the carriers C1 and C2 may adopt different waveforms if the carriers C1 and C2 have the same cycle.

It is assumed that a voltage vector to be adopted in the voltage source inverter 2 is represented as "d4·V4+d6·V6" (d4+d6≤1) using a vector operation. Herein, "unit voltage vector Vg" is introduced. In this representation, the value of "g" is a value which is obtained by assigning values "4", "2", and "1" to U-phase, V-phase, and W-phase, respectively, and summing up the respectively-assigned values when upper arms corresponding to the three phases are brought into conduction, and the value takes an integer ranging from 0 to 7.

The unit voltage vector V4, for example, represents a switching pattern in which the switching elements Sup, Svn, and Swn are in conduction and the switching elements Sun, Svp, and Swp are not in conduction. Further, the unit voltage vector V6 represents a switching pattern in which the switching elements Sup, Svp, and Swn are in conduction and the switching elements Sun, Svn, and Swp are not in conduction.

FIGS. 8 and 10 to 12 shows a case where the voltage vector indicating a switching pattern to be adopted in the voltage source inverter 2 is represented as "d4·V4+d6·V6" using the vector operation and the relation of d0=1−(d4+d6)>0 holds. In such a case, the unit voltage vectors V0, V4, and V6 have respective lengths at a ratio of d0:d4:d6. In this case, in one cycle T0 of the carrier C2, the switching is performed with the unit voltage vectors V0, V4, and V6 adopted at a ratio of d0:d4:d6.

Thus, it is assumed that the ratio of the length adopted for each unit voltage vector to one cycle of the carrier is also referred to as a time ratio. Herein, the relation of d0+d4+d6=1 holds.

When the unit voltage vector V0 is adopted, since no current flows in the voltage source inverter 2, the link current Idc is 0. Therefore, when the current source converter commutates the current in a period where a switching pattern corresponding to the unit voltage vector V0 is adopted, a so-called zero current switching is performed.

Figure 8:
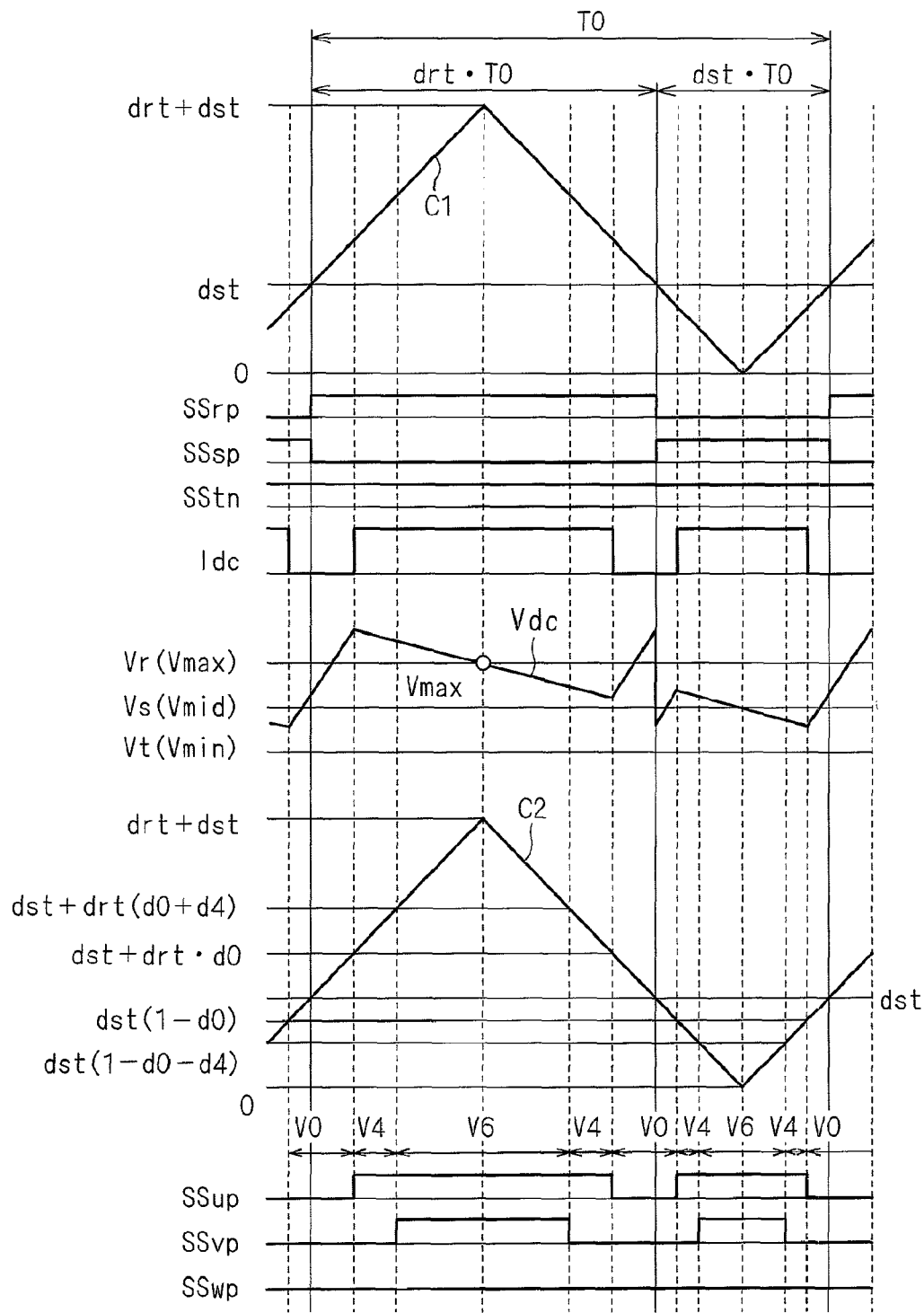
FIGS. 8 to 13 are graphs each showing an operation of the direct AC-AC power converter.
Figure 10:
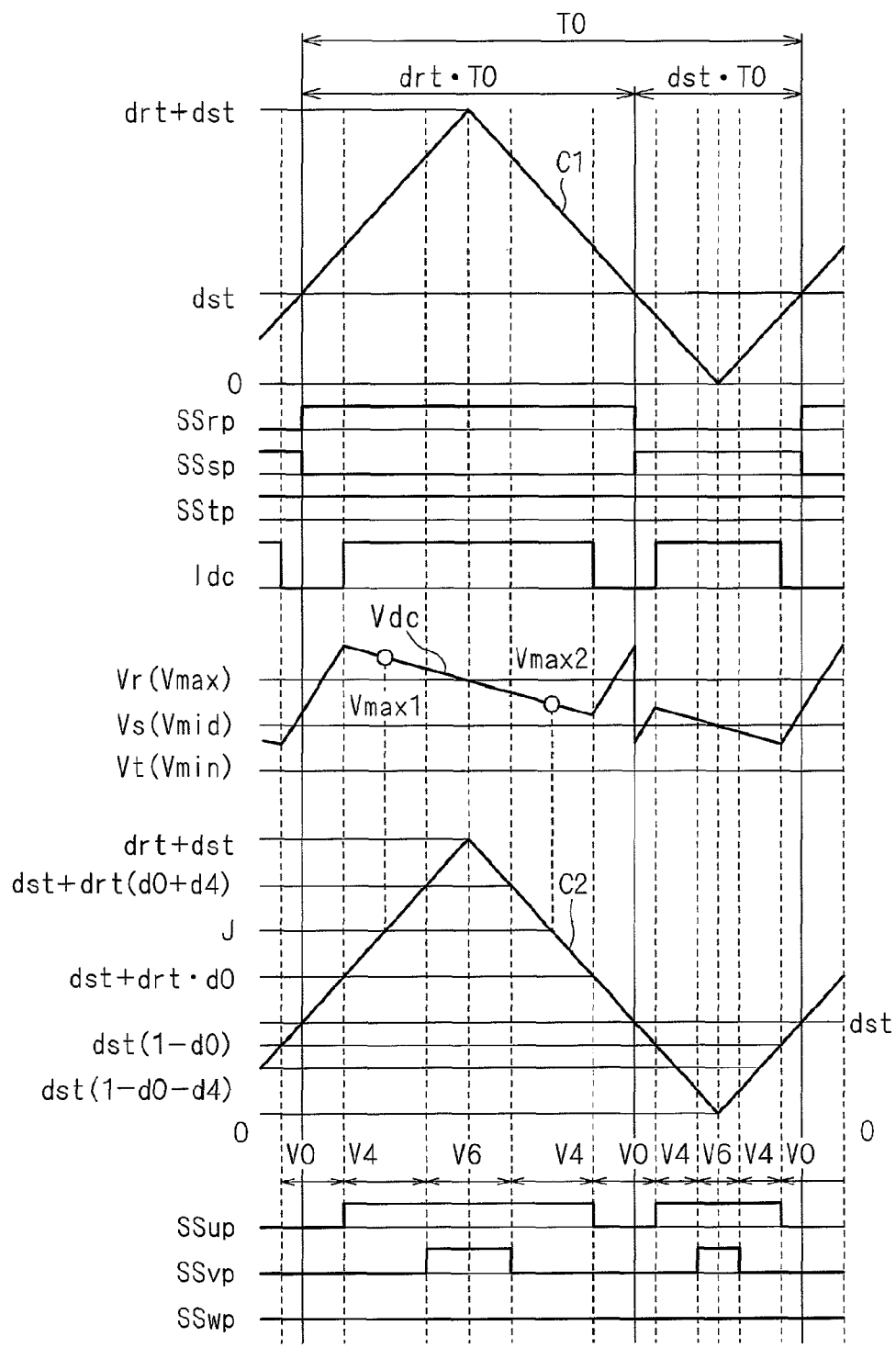
Figure 11:
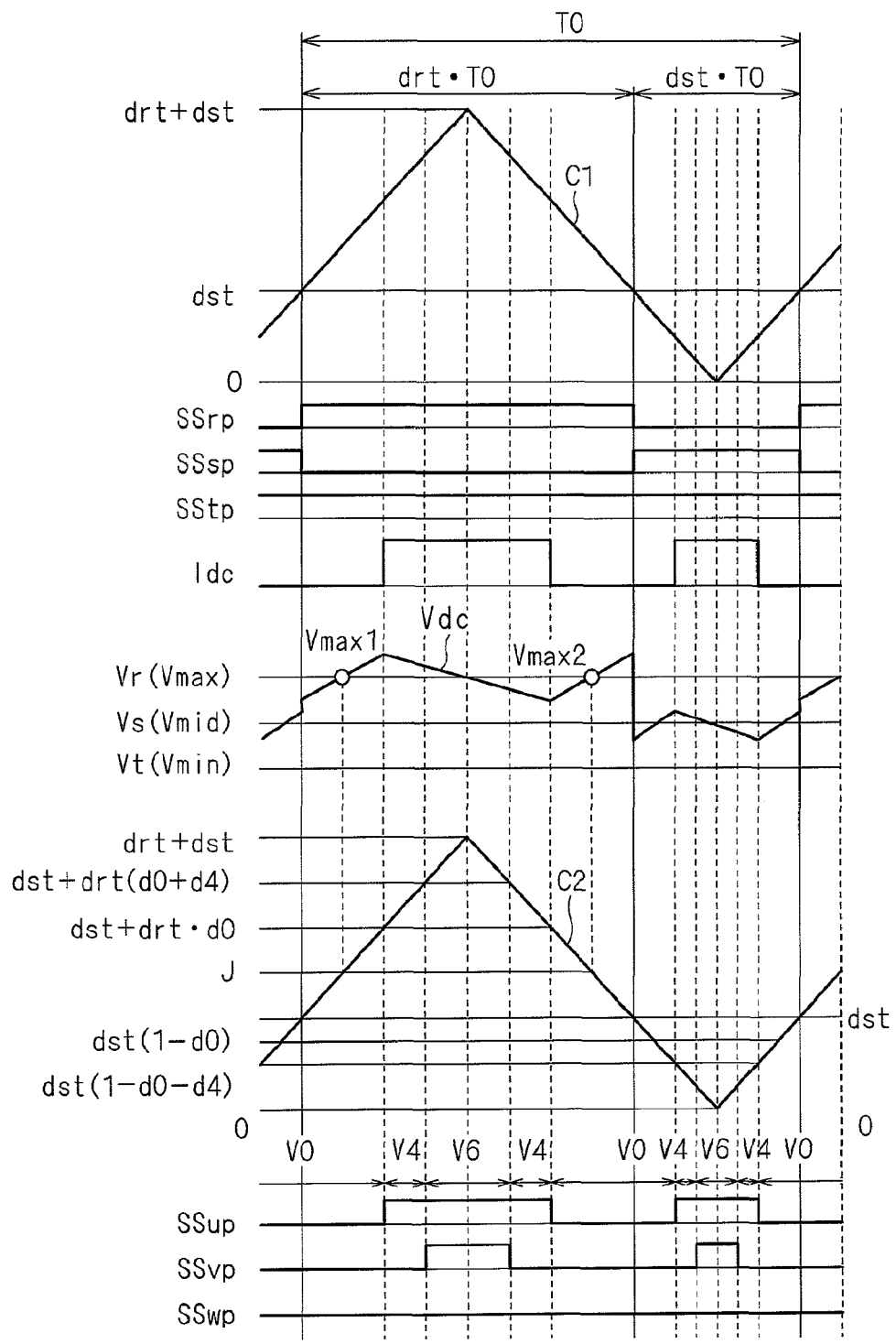

From the above-discussed viewpoint, since it is publicly known (for example, Japanese Patent Application Laid Open Gazette No. 2007-312589 and the like) how to set the period where the unit voltage vector V0, V4, or V6 is adopted as the switching pattern in the voltage source inverter 2, specific discussion on this technique will be omitted herein. FIGS. 8, 10, and 11 show a specific exemplary case where the switching signal SSup becomes active when the carrier C2 takes a value not lower than dst+drt·d0 or a value not higher than dst(1−d0), the switching signal SSvp becomes active when the carrier C2 takes a value not lower than dst+drt(d0+d4) or a value not higher than dst(1−d0−d4), and the switching signal SSwp is always inactive. From the characteristic feature of the control of the voltage source inverter 2, the switching signals SSun, SSvn, and SSwn become active complementarily to the switching signals SSup, SSvp, and SSwp, respectively.

In the above case, the unit voltage vector V6 is positioned at the midpoint of the period drt·T0. As discussed above, it is desirable that the point in time when the link voltage Vdc is measured should be the midpoint of the period drt·T0. Therefore, in the case where the value d6=1−(d0+d4) is large as shown in FIG. 8, since the switching of the voltage source inverter 2 is far away from the midpoint of the period drt·T0, the link voltage Vdc is less susceptible to the effect of the switching noise of the voltage source inverter 2.

In the case as shown in FIGS. 10 and 11 where the value d6 is small, however, since the switching of the voltage source inverter 2 is closer to the midpoint of the period drt·T0, the link voltage Vdc becomes susceptible to the effect of the switching noise of the voltage source inverter 2.

Then, the link voltage Vdc is measured along the following steps.

First, a first measured value Vmax1 of the link voltage Vdc is measured at the midpoint of a first section in which only a single switching pattern is adopted for the longest time in the period drt·T0. With reference to FIG. 10, the left section out of two sections in the period drt·T0, in which the unit voltage vector V4 is adopted, can be adopted as the first section. With reference to FIG. 11, the left section out of two sections in the period drt·T0, in which the unit voltage vector V0 is adopted, can be adopted as the first section.

Further, a second measured value Vmax2 of the link voltage Vdc is measured at the midpoint of a second section in which only a single switching pattern is adopted for a time as long as the first section or for the second longest time next to the first section. With reference to FIG. 10, the right section out of two sections in the period drt·T0, in which the unit voltage vector V4 is adopted, can be adopted as the second section. With reference to FIG. 11, the right section out of two sections in the period drt·T0, in which the unit voltage vector V0 is adopted, can be adopted as the second section.

Then, a representative value Vmax of the link voltage Vdc in one cycle T0 including the period drt·T0 is obtained by interpolation of the first measured value Vmax1 and the second measured value Vmax2. Since the representative value Vmax is the upper envelope voltage E1 as discussed above, the maximum value of the link voltage Vdc can be obtained by dividing the representative value Vmax by cos 0. Then, as discussed above, the control of the voltage source inverter 2 can be performed by using the modulation factor based on the maximum value of the link voltage Vdc.

In the case shown in FIG. 8, however, the first section in which only a single switching pattern is adopted for the longest time in the period drt·T0 is a section in which the unit voltage vector V6 is adopted. Then, the section in which the unit voltage vector V6 is adopted is sandwiched in time by a pair of third sections (in which the unit voltage vector V4 is adopted) in both of which the same single switching pattern is adopted. In other words, the third sections in each of which only the unit voltage vector V4 different from the unit voltage vector V6 adopted in the first section is adopted are provided before and after the first section. Since the first measured value of the link voltage Vdc in this case is measured at the midpoint of the period drt·T0 but the measurement point is far away from the timing for the switching of the voltage source inverter 2, it is judged that the link voltage Vdc is appropriately measured. Therefore, instead of obtaining the representative value of the link voltage Vdc from the first measured value Vmax1 and the second measured value Vmax2 which are obtained by measurement, the representative value of the link voltage Vdc can be measured in a simple manner.

Figure 12:
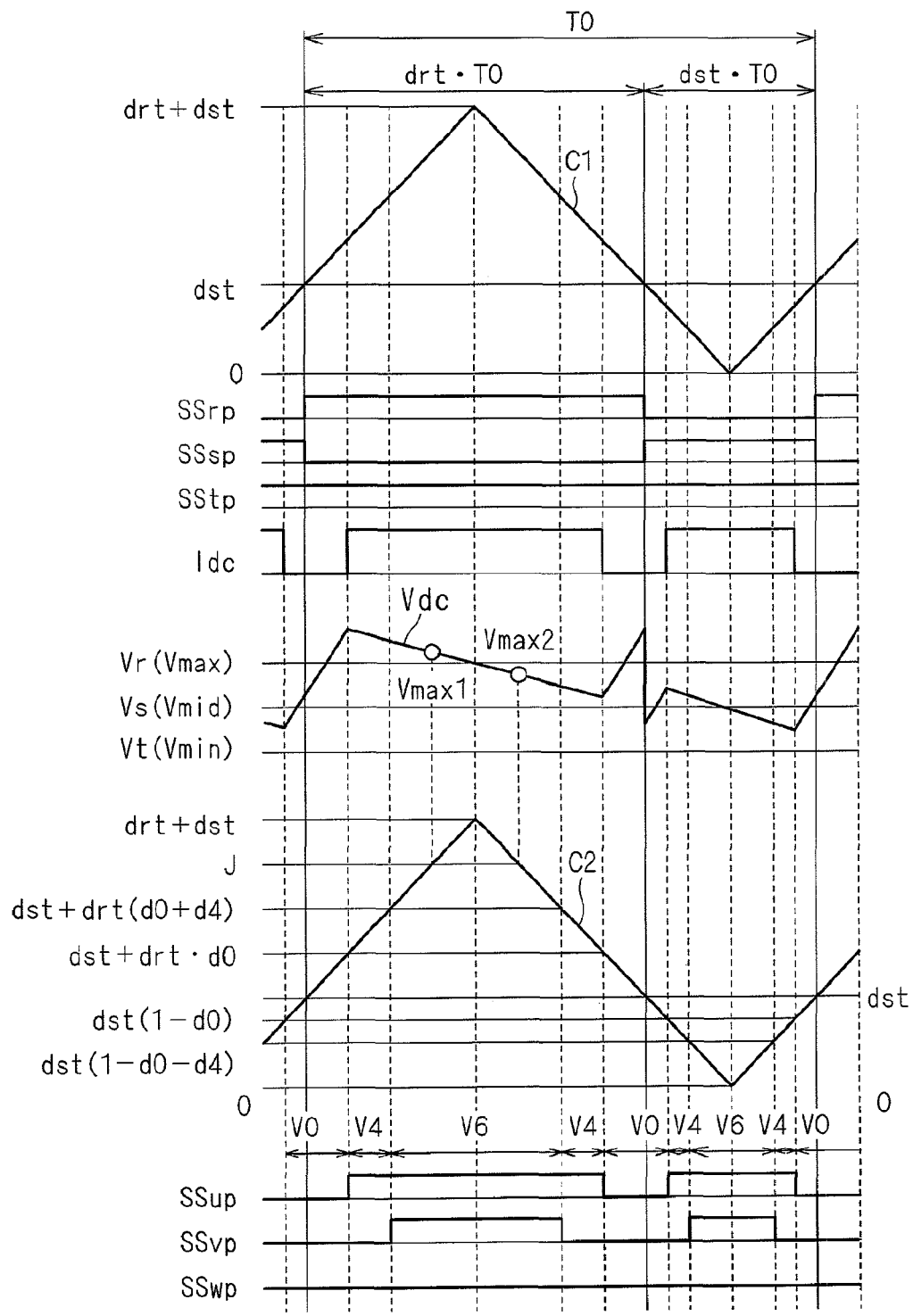

As a matter of course, also in this case, as shown in FIG. 12, the representative value Vmax may be obtained by interpolation of the first measured value Vmax1 and the second measured value Vmax2 which are obtained by measurement performed far away from the midpoint of the period drt·T0 and the third sections.

Thus, since the link voltage Vdc is measured at a timing far away from the timing for the switching of the voltage source inverter 2, the measured value of the link voltage Vdc is less susceptible to the effect of the switching noise of the voltage source inverter 2. Further, since the upper envelope voltage E1 can be obtained only by interpolation of the first measured value Vmax1 and the second measured value Vmax2, typically obtaining the arithmetic mean of these measured values, more excellent responsiveness can be achieved as compared with the complicated averaging in the technique shown in Japanese Patent Application Laid Open Gazette No. 2010-98848.

Moreover, even if the filter 6 is provided on the input side of the current source converter 1 and the three-phase voltages supplied to the input terminals Pr, Ps, and Pt vary due to the filter 6, it is possible to obtain the representative value of the link voltage Vdc without the effect.

Further, since the first period drt·T0 is longer than the second period dst·T0, the conduction ratio drt/dst of the line current flowing in the maximum phase in the current source converter 1 to the line current is flowing in the intermediate phase is increased, and therefore the current inputted to the direct AC-AC power converter circuit becomes approximate to a sine wave.

Figure 13:
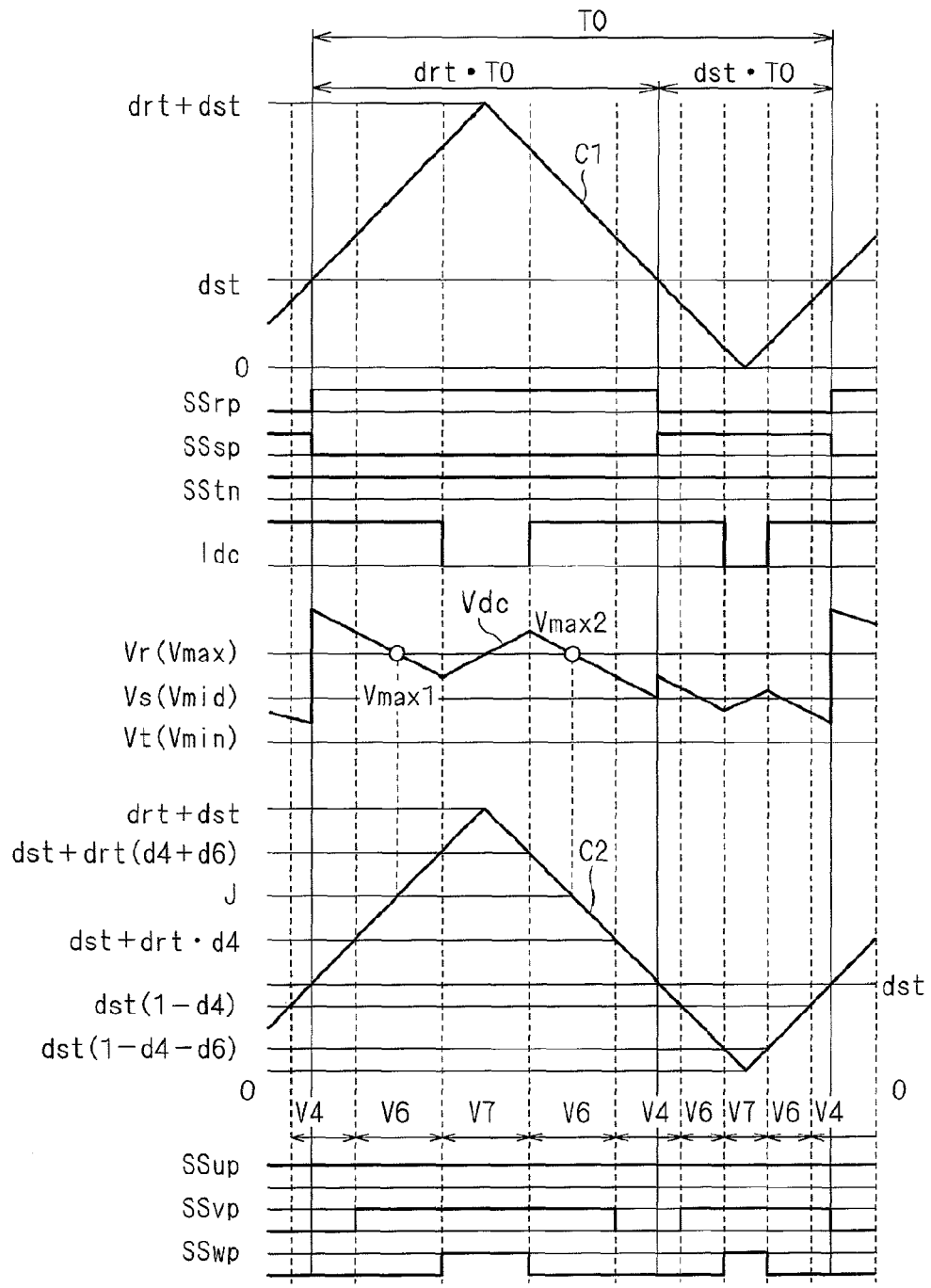

Though FIGS. 8 and 10 to 12 each show the case where the zero current switching is adopted, FIG. 13 shows a case where the zero current switching is not adopted. Specifically, FIG. 13 shows a case where the voltage vector indicating a switching pattern to be adopted in the voltage source inverter 2 is represented as "d4·V4+d6·V6" using the vector operation and the relation of d7=1−(d4+d6)>0 holds. In this case, in one cycle T0 of the carrier C2, the switching is performed with the unit voltage vectors V7, V4, and V6 adopted at a ratio of d7:d4:d6.

Specifically, a specific exemplary case is shown, where the switching signal SSvp becomes active when the carrier C2 takes a value not lower than dst+drt·d4 or a value not higher than dst(1−d4), the switching signal SSwp becomes active when the carrier C2 takes a value not lower than dst+drt(d4+d6) or a value not higher than dst(1−d4−d6), and the switching signal SSup is always active. The switching signals SSun, SSvn, and SSwn become active complementarily to the switching signals SSup, SSvp, and SSwp, respectively.

In the case shown in FIG. 13, though a section in which the unit voltage vector V7 is adopted is positioned at the midpoint of the period drt·T0, each of the sections in which the unit voltage vector V6 is adopted is longer than the above section. Therefore, a pair of the sections in which the unit voltage vector V6 is adopted correspond to the first section and the second section, and the first measured value Vmax1 and the second measured value Vmax2 are obtained by measurement in these sections, respectively.

In the section in which the unit voltage vector V7 is adopted, since no current flows in the voltage source inverter 2, the link current Idc is 0.

In the cases shown in FIGS. 8 and 10 to 13, the symmetric triangular wave is adopted as the carrier C2, like the carrier C1. In these figures, especially, shown are the cases where the signal wave takes a constant value in the first period in which the carrier C2 is compared and the switching pattern adopted in the first section and the switching pattern adopted in the second section are the same.

Specifically, in the cases shown in FIGS. 8 and 10 to 12, the signal waves have the values dst+drt(d0+d4), dst+drt·d0, dst(1−d0), and dst(1−d0−d4), respectively, each taking a constant value in the period drt·T0 which is the first period. In FIG. 10, the first section and the second section are a pair of sections in which the switching pattern indicated by the unit voltage vector V4 is adopted. In FIG. 11, the first section and the second section are a pair of sections in which the switching pattern indicated by the unit voltage vector V0 is adopted. In FIG. 13, the first section and the second section are a pair of sections in which the switching pattern indicated by the unit voltage vector V6 is adopted.

Since the signal wave takes a constant value in the first period and the carrier C2 compared with the signal wave is of symmetry triangle wave, the first section and the second section have the same length. Further, the interval between the midpoint of the first section and that of the second section is divided into half in time by the midpoint of the first period. Therefore, the arithmetic mean of the first measured value Vmax1 and the second measured value Vmax2 is appropriate as the representative value of the link voltage Vdc at the midpoint of the first period.

Further, the carrier C2 takes the same value at the midpoint of the first section and that of the second section. In other words, the timing at which the first measured value Vmax1 is measured and the timing at which the second measured value Vmax2 is measured are determined by the timing at which the carrier C2 takes a single predetermined value J.

Thus, by adopting the symmetric triangular wave for the carrier C2, it is possible to easily measure the upper envelope voltage E1 of the link voltage Vdc.

Figure 14:
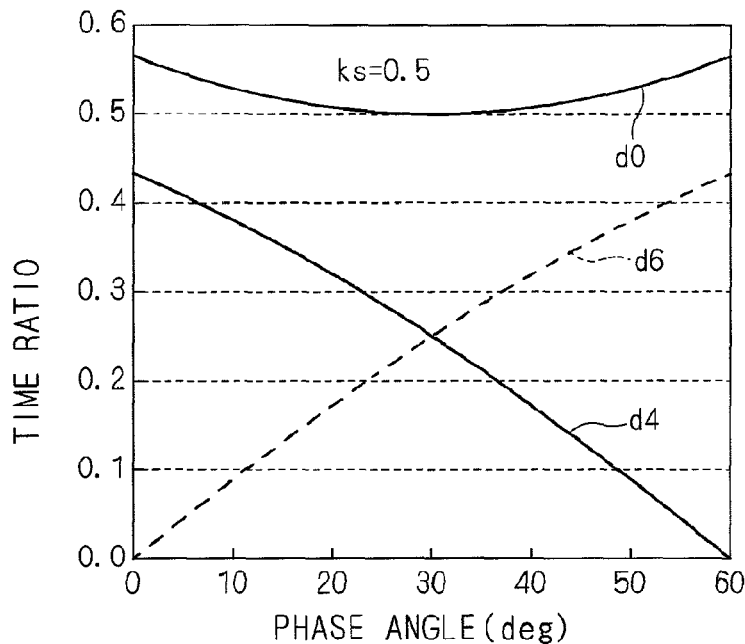
FIGS. 14 and 15 are graphs each showing time ratios.

FIG. 14 is a graph showing respective time ratios of d0, d4, and d6 and shows the dependence upon the phase θ in a case where the modulation factor ks is 0.5. In this relation, it is desirable that the link voltage Vdc should be measured when the unit voltage vector corresponding to the maximum time ratio is adopted. That is because controlling the voltage source inverter 2 based on the link voltage Vdc requires a time for analog-digital conversion in order to use the link voltage Vdc for computation and there arises a delay in operations of the switching elements Syp and Syn which operate in response to the switching signals SSyp and SSyn generated on the basis of the computation.

From FIG. 14, it can be seen that the maximum value among d0, d4, and d6 becomes minimum when the phase angle θ is 30° (=π/6), and at that time, d4=d6. This characteristic feature does not depend on the modulation factor ks. This is based on that the voltage vector indicating the switching pattern to be adopted in the voltage source inverter 2 is represented as "d4·V4+d6·V6" using the vector operation.

In the above voltage vector, the unit voltage vector V0 is also introduced and it is assumed that d0=1−(d4+d6). Further, the phase φ in a case where the unit voltage vectors V4 and V6 are represented by using space vectors is introduced with the position of the unit voltage vector V4 as a reference. At that time, when the output of the voltage source inverter 2 becomes sine-wave-like, assuming that the modulation factor is ks, it is publicly known (for example, L. Wei, T. A. Lipo, "A Novel Matrix Converter Topology with Simple Commutation, IEEE ISA2001, vol. 3, pp. 1749-1754, 2001 and the like) that the time ratios of d0, d4, and d6 are represented as [1−ks·sin(φ+π/3)], ks·sin(π/3−φ), and ks·sin φ (where 0≤φ≤π/3), respectively. Since 0≤φ≤π/3, d0>d4 and d0>d6. Then, d0 becomes minimum when φ=π/6, and at that time, d4=d6=ks·sin(π/6). With reference to FIG. 14, since ks=0.5, d4=d6=0.5×(½)=0.25 and d0=1−0.5=0.5.

Figure 15:
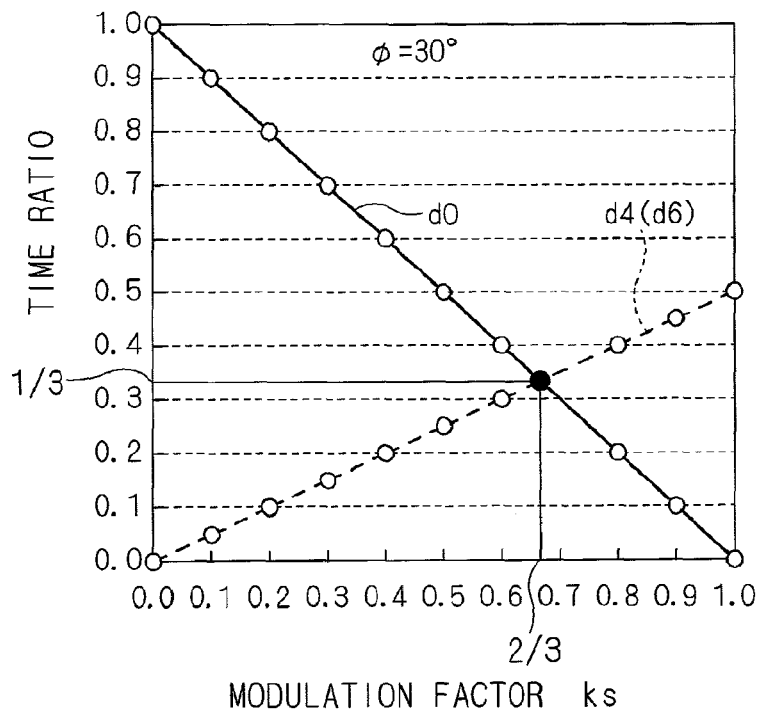

FIG. 15 is a graph showing respective time ratios of d0, d4, and d6 and shows the dependence upon the modulation factor ks in a case where the phase θ=ρ/6. When ks=0, d0>d4=d6, and when ks=1, d0<d4=d6. Then, as the modulation factor ks increases, d0 decreases and d4=d6 increases. When ks=2/3, d0=d4=d6, and the maximum value among d0, d4, and d6 takes the minimum value 1/3 with respect to the variation of the modulation factor ks.

Since the modulation factor ks at the time when d0=d4=d6 if φ=π/6 satisfies 1−ks·sin(π/2)=ks·sin(π/6), ks=2/3. At that time, d0=d4=d6=(2/3)·sin(π/6)=1/3.

From the above, the maximum value among d0, d4, and d6 is a value not less than 1/3 even if the modulation factor ks and the phase θ take any values.

Then, the first period is not shorter than half of the cycle T0 of the carrier C1, and when the symmetric triangular wave is adopted as the carrier C2, the first section and the second section have the same length. Therefore, the respective lengths of the first section and the second section in which the link voltage Vdc is measured ensure the length not shorter than 1/2·1/2·1/3=1/12 of the carrier cycle however short the lengths are.

Now, as an example, a case where a carrier frequency fc=6 kHz is adopted will be considered. At that time, T0=1/fc=167 µs. The longer one (i.e., the first period) of the periods dst·T0 and drt·T0 is not shorter than T0/2=83 µs. Then, in the first period, the length used by the unit voltage vector adopted in the first section is 83 µs/3=27.6 µs or more. As discussed earlier, when the symmetric triangular wave is adopted as the carrier C2, the respective lengths of the first section and the second section in which the link voltage Vdc is measured are each 27.6 µs/2=13.8 µs. In order to perform sampling at the respective midpoints of these sections, the time acceptable for the analog-digital conversion and the switching delay is about 6.9 µs. Further, the delay time introduced for the control using the link voltage Vdc is usually 1 to 2 µs. Then, since the relation of 13.8>6.9+2 holds, it can be seen that the respective lengths of the first section and the second section are sufficiently long for the measurement of the link voltage Vdc and the control of the voltage source inverter 2 using the link voltage Vdc in the above cases, even if the modulation factor ks and the phase θ have any values.

Figure 16:
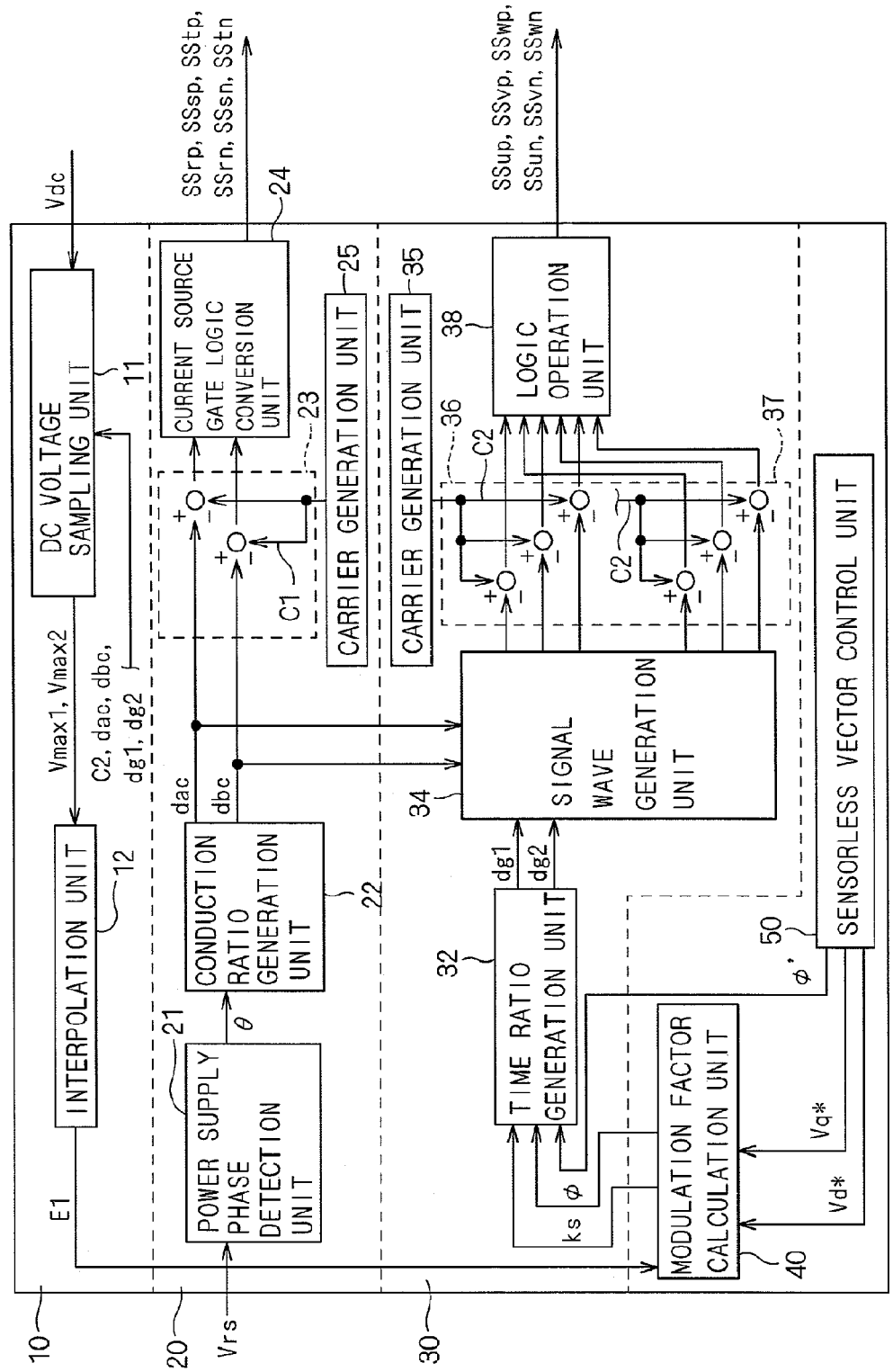
FIG. 16 is a block diagram showing a conceptual example of specific internal configuration of a control unit.

FIG. 16 shows a conceptual example of specific internal configuration of a control unit for performing such controls as discussed above. A control unit 100 comprises a DC voltage detection unit 10, a converter control unit 20, an inverter control unit 30, a modulation factor calculation unit 40, and a sensorless vector control unit 50. As the load 4 (see FIG. 1), it is assumed to use a three-phase motor.

The DC voltage detection unit 10 comprises a DC voltage sampling unit 11 and an interpolation unit 12. The DC voltage sampling unit 11 makes sampling of the link voltage Vdc at the above-discussed timing, to thereby detect respective maximum values of the first measured value Vmax1 and the second measured value Vmax2. The interpolation unit 12 interpolates the first measured value Vmax1 and the second measured value Vmax2, typically obtains the arithmetic mean of these measured values, to thereby output the arithmetic mean as the upper envelope voltage E1 of the link voltage Vdc.

The DC voltage detection unit 10 inputs the carrier C2, the conduction ratios dac and dbc of the current source converter 1 and the time ratios dg1 and dg2 of the voltage source inverter 2 in order to obtain a timing for detection of the first measured value Vmax1 and the second measured value Vmax2. The indices "a", "b", and "c" exclusively represent the indices "r", "s", and "t", and in the above-discussed case, the indices "a", "b", and "c" represent the indices "r", "s", and "t", respectively. Further, the indices "g1" and "g2" take any one of pairs of values (4, 6), (6, 2), (2, 3), (3, 1), (1, 5), and (5, 4). In the above-discussed case, the indices "g1" and "g2" take a pair of d4 and d6.

The converter control unit 20 receives a line voltage Vrt (especially, a phase angle θ) and outputs the switching signals SSrp, SSsp, SStp, SSrn, SSsn, and SStn.

The converter control unit 20 has a power supply phase detection unit 21, a conduction ratio generation unit 22, a comparator 23, a current source gate logic conversion unit 24, and a carrier generation unit 25.

The power supply phase detection unit 21 detects, for example, the line voltage Vrs and thereby detects a phase angle θ of the three-phase AC voltages applied to the input terminals Pr, Ps, and Pt, respectively, and outputs the phase angle to the conduction ratio generation unit 22.

The conduction ratio generation unit 22 generates the conduction ratios dac and dbc on the basis of the received phase angle θ and the conduction ratio of the line current shown in the graph of FIG. 5 (for example, on the basis of a predetermined table).

The carrier generation unit 25 generates the carrier C1. The comparator 23 compares the carrier C1 with the conduction ratios dac and dbc and outputs the comparison results. The current source gate logic conversion unit 24 generates the switching signals SSrp, SSsp, SStp, SSrn, SSsn, and SStn on the basis of the comparison results.

The inverter control unit 30 receives the phase angle θ, the modulation factor ks, a control phase angle φ, and a command phase angle φ' indicating a rotation position of the motor and outputs the switching signals SSup, SSvp, SSwp, SSun, SSvn, and SSwn.

The inverter control unit 30 has a time ratio generation unit 32, a signal wave generation unit 34, a carrier generation unit 35, a comparator 36, and a logic operation unit 38.

The time ratio generation unit 32 generates the time ratios dg1 and dg2 of the voltage source inverter 2 on the basis of the modulation factor ks received from the modulation factor calculation unit 40, the control phase angle φ, and the command phase angle φ' received from the sensorless vector control unit 50.

The signal wave generation unit 34 generates a signal wave from the time ratios dg1 and dg2 and the conduction ratios dac and dbc. In the above-discussed case, the signal wave generation unit 34 generates dst(1−d0−d4), dst(1−d0), dst+drt·d0, and dst+drt(d0+d4). The signal wave generation unit 34 further outputs a value of 0 and drt+dst.

The carrier generation unit 35 generates the carrier C2. When the carriers C2 and C1 have the same phase and the same form, either one of the carrier generation units 25 and 35 has only to be adopted.

The comparator 36 compares the signal wave with the carrier C2 and the logic operation unit 38 performs a logic operation of the comparison result. By the logic operation, the logic operation unit 38 generates the switching signals SSup, SSvp, SSwp, SSru, SSvn, and SSwn.

The modulation factor calculation unit 40 receives the upper envelope voltage E1 from the interpolation unit 12 and a d-axis voltage command Vd* and a q-axis voltage command Vq* from the sensorless vector control unit 50, calculates the modulation factor ks and the control phase angle φ, and outputs these to the time ratio generation unit 32.

The sensorless vector control unit 50 calculates a rotation speed w of the motor and the command phase angle φ' from the line current flowing in the output terminals Pu, Pv, and Pw and generates the d-axis voltage command Vd* and the q-axis voltage command Vq* on the basis of the calculated rotation speed ω and command phase angle φ' and a rotation speed command ω* and duty which are inputted from the outside.

As the carrier used for pulse width modulation of the voltage source inverter 2 and further as the carrier used for pulse width modulation of the current source converter 1, an asymmetric carrier may be used. As an extreme case, measurement of the link voltage Vdc using a carrier having a saw-tooth wave will be discussed below.

Figure 17:
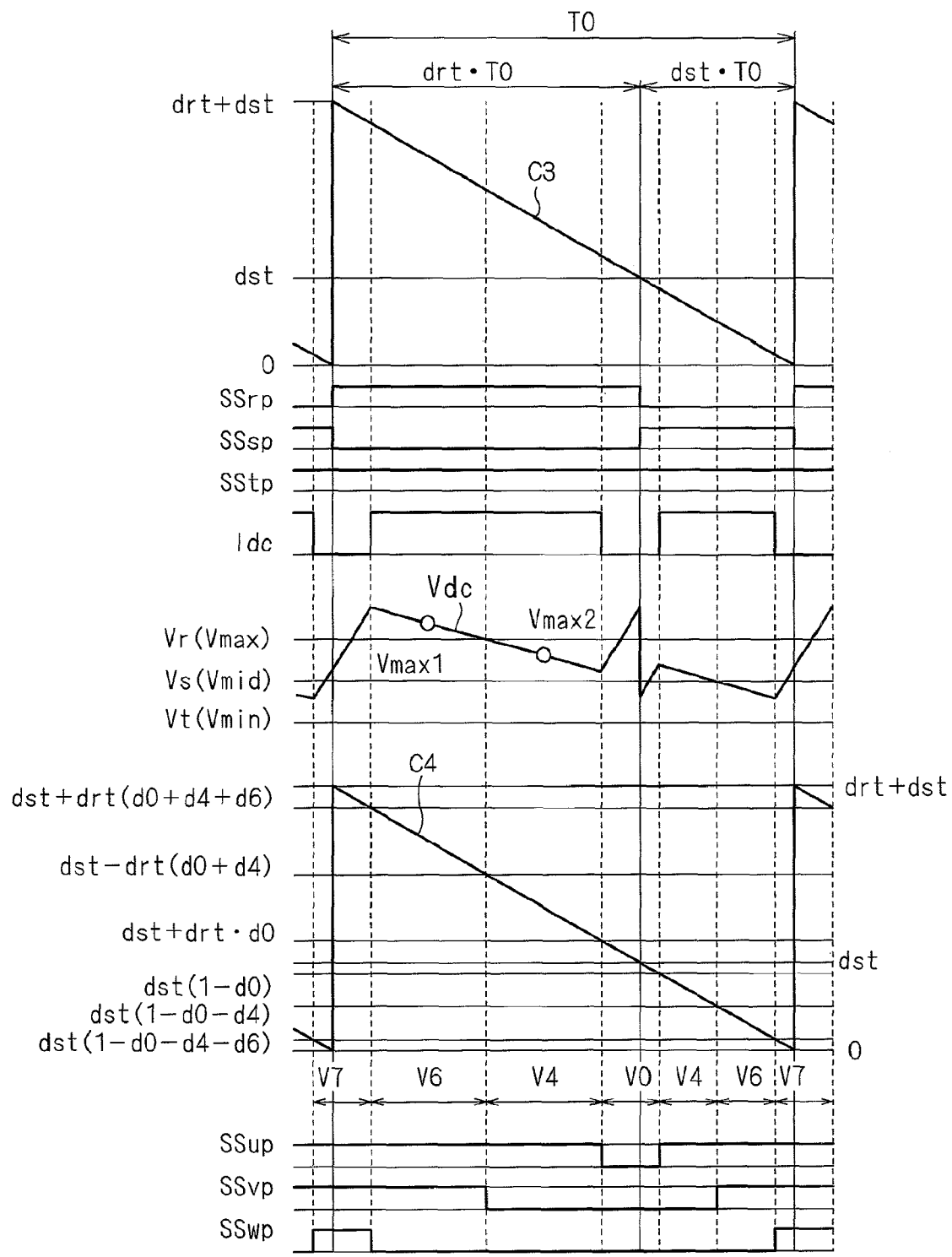
FIG. 17 is a graph showing an operation of the direct AC-AC power converter in a case where a saw-tooth wave is used as a carrier.

FIG. 17 is a graph showing an operation of the direct AC-AC power converter in a case where carriers C3 and C4 are adopted for the commutation of the current source converter 1 and the switching of the voltage source inverter 2, respectively. The carriers C3 and C4 have a negative inclination, the same cycle T0, and a saw-tooth wave of the same form.

In FIG. 17, the unit voltage vectors V0 and V7 are adopted and the zero current switching is achieved. The carriers C3 and C4 sharply increase at the same timing, and the voltage source inverter 2 adopts the unit voltage vector V7 in a section including this timing. Herein, a case where the voltage source inverter 2 adopts the unit voltage vectors V0, V4, V6, and V7 in one cycle of the carrier C4 is shown, and among the time ratios d0, d4, d6, and d7 of the unit voltage vectors, the relation of d0+d4+d6+d7=1 holds.

Since generation of the switching signals SSrp, SSsp, SStp, SSup, SSvp, SSwp shown in FIG. 17 is publicly known (for example, Japanese Patent Application Laid Open Gazette No. 2009-106110 and the like), specific discussion on this technique will be omitted herein.

As a specific exemplary case, in FIG. 17, the switching signals SSsp and SSrp become inactive and active, respectively, when the carrier C3 has a time ratio not lower than dst. Then, the switching signals SSsp and SSrp become active and inactive, respectively, when the carrier C3 has a time ratio lower than dst.

The switching signal SSwp becomes active when the carrier C4 takes a value not lower than dst+drt(d0+d4+d6) or a value not higher than dst(1−d0−d4−d6), the switching signal SSvp becomes active when the carrier C4 takes a value not lower than dst+drt(d0+d4) or a value not higher than dst(1−d0−d4), and the switching signal SSup becomes active when the carrier C4 takes a value not lower than dst+drt·d0 or a value not higher than dst(1−d0). The switching signals SSun, SSvn, and SSwn become active complementarily to the switching signals SSup, SSvp, and SSwp, respectively.

In the above example, a case where d6>d4>d0 and d6>d4>d7 is shown. Therefore, the unit voltage vector V6 is adopted in the first section in which only a single switching pattern is adopted for the longest time in the period drt·T0. Then, the first measured value Vmax1 of the link voltage Vdc is measured at the midpoint of the section. Further, the unit voltage vector V4 is adopted in the second section in which only a single switching pattern is adopted for a time as long as the first section or for the second longest time next to the first section. Then, the second measured value Vmax2 of the link voltage Vdc is measured at the midpoint of the section.

Thus, even when the saw-tooth wave is used for the carrier, the first section and the second section can be recognized and the link voltage Vdc can be measured at a point in time far away from the timing for the switching of the voltage source inverter 2. Therefore, the link voltage Vdc is less susceptible to the effect of the switching noise of the voltage source inverter 2.

Unlike in the case where the symmetric triangular wave is used for the carrier, however, the upper envelope voltage E1 of the link voltage Vdc cannot be obtained by obtaining the arithmetic mean of the first measured value Vmax1 and the second measured value Vmax2. Though it cannot be clearly seen from FIG. 17, the first section in which the unit voltage vector V6 is adopted and the second section in which the unit voltage vector V4 is adopted have different inclinations of the link voltage Vdc from each other. The difference in the inclination depends on the charge-discharge rates of the capacitors Cr, Cs, and Ct. Further, though the link current Idc is represented by a simple rectangular wave in FIG. 17, like in FIGS. 8 and 10 to 13, the link current Idc actually pulsates.

From the above, it can be seen that in the case where the saw-tooth wave is adopted for the carrier, it is necessary to perform interpolation of the first measured value Vmax1 and the second measured value Vmax2 in order to obtain the upper envelope voltage E1 of the link voltage Vdc. The arithmetic mean corresponds to the interpolation of the first measured value Vmax1 and the second measured value Vmax2 with the same weight.

Hereinafter, discussion will be made on how much error exists between the arithmetic mean of the first measured value Vmax1 and the second measured value Vmax2 and the upper envelope voltage E1 of the link voltage Vdc. Discussion will be made first on the case where the symmetric triangular wave is used as the carrier, and then discussion will be made on the case where the saw-tooth wave is used as the carrier as a comparative example.

Figure 18:
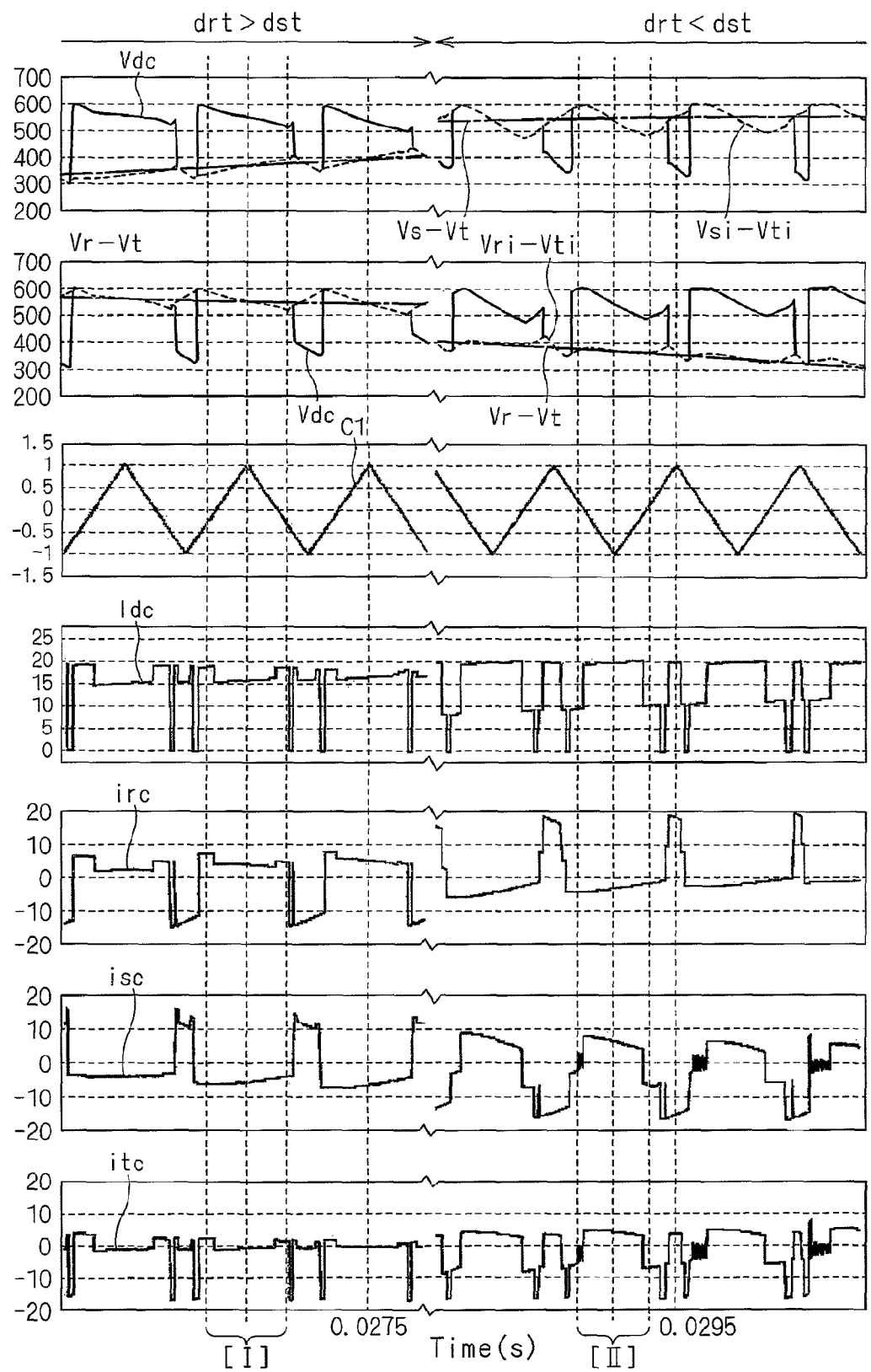
FIG. 18 is a graph showing an operation of the direct AC-AC power converter in a case where a symmetric triangular wave is used as a carrier.

FIG. 18 is a graph showing an operation of the direct AC-AC power converter in the case where the symmetric triangular wave is used as carrier. Specifically, from the uppermost stage, the first-stage graph shows the link voltage Vdc and potential differences (Vs−Vt) and (Vsi−Vti), the second-stage graph shows the link voltage Vdc and potential differences (Vr−Vt) and (Vri−Vti), the third-stage graph shows the carrier C1, the fourth-stage graph shows the link current Idc, and the fifth to seventh-stage graphs show the currents irc, isc, and itc, respectively. The first to seventh-stage graphs have a common horizontal axis representing time.

In the left side of the break of each graph, the AC voltages Vr and Vs correspond to the maximum phase and the intermediate phase, respectively, and this period corresponds to the period after the phase angle of 60° of the three-phase AC voltage with reference to FIG. 5. In the right side of the break of each graph, the AC voltages Vr and Vs correspond to the intermediate phase and the maximum phase, respectively, and this period corresponds to the period after the phase angle of 60° of the three-phase AC voltage with reference to FIG. 5. Therefore, in the control of the current source converter 1, the relation of drt>dst holds on the conduction ratios in the left side of the break of each graph and the relation of drt<dst holds on the conduction ratios in the right side the break of each graph.

The left side of the break of each graph shows a case where the voltage source inverter 2 adopts the unit voltage vectors V0, V4, V6, V4, V6, and V0 in this order in the first period drt·T0 as shown in FIG. 8. Similarly, the right side of the break of each graph shows a case where the voltage source inverter 2 adopts the unit voltage vectors V0, V4, V6, V4, V6, and V0 in this order in the second period dst·T0.

Among three broken lines representing timing groups [I] and [II], the left-side line and the right-side line each indicate a point in time when the unit voltage vector V4 is adopted and the center line sandwiched by these two lines indicates the midpoint of the first period (when the unit voltage vector V6 is adopted in this case).

Since the voltage source inverter 2 outputs three-phase AC, when the current of one phase among the three-phase AC, which is outputted at one point in time, is 0, the currents of the other two phases have opposite directions and the same absolute value. Since the link current Idc at the timing when the unit voltage vector V6 is adopted is almost equal to the link current Idc at the timing when the unit voltage vector V4 is adopted in the timing group [I], it can be understood that the V-phase current among the three-phase currents outputted from the voltage source inverter 2 is almost 0.

On the other hand, when the currents of two phases among the outputted three-phase currents are equal to each other, the current of the other one phase has a direction opposite to the direction of the currents of the two phases and an absolute value equal to the sum of the currents of the two phases. The timing group [II] corresponds to such a case, and the link current Idc at the timing when the unit voltage vector V6 is adopted is almost twice as large as the link current Idc at the timing when the unit voltage vector V4 is adopted.

The link current Idc flows in the filter capacitors Cr, Cs, and Ct and generates ripple in the link voltage Vdc. In the case of the timing group I, the link current Idc at the timing when the unit voltage vector V4 is adopted and the link current Idc at the timing when the unit voltage vector V6 is adopted are almost equal to each other. The current irc thereby becomes positive, the capacitor Cr is discharged, and the link voltage Vdc decreases.

In the case of the timing group [II], since the link current Idc at the timing when the unit voltage vector V4 is adopted is about half of the link current Idc at the timing when the unit voltage vector V6 is adopted, the polarity of the current isc becomes negative when the unit voltage vector V4 is adopted and becomes positive when the unit voltage vector V6 is adopted. Therefore, the link voltage Vdc increases when the unit voltage vector V4 is adopted and decreases when the unit voltage vector V6 is adopted.

Thus, the link voltage Vdc sometimes have different ripples depending on the phase of the three-phase AC outputted from the voltage source inverter 2. By adopting the symmetric triangular wave for the carrier, however, the arrangement of the unit voltage vectors adopted in the first period becomes symmetry with respect to the center point of the first period as a point of symmetry. Therefore, by measuring the link voltage Vdc in two first sections where the same unit voltage vector is adopted and two second sections where the same unit voltage vector is adopted and performing interpolation of the measured results, the upper envelope voltage E1 of the link voltage Vdc can be obtained. Moreover, as discussed with reference to FIGS. 8 and 10 to 13, when the first measured value Vmax1 and the second measured value Vmax2 are obtained by measurement at the respective midpoints in the first section and the second section, the upper envelope voltage E1 can be obtained by obtaining the arithmetic mean.

Figure 19:
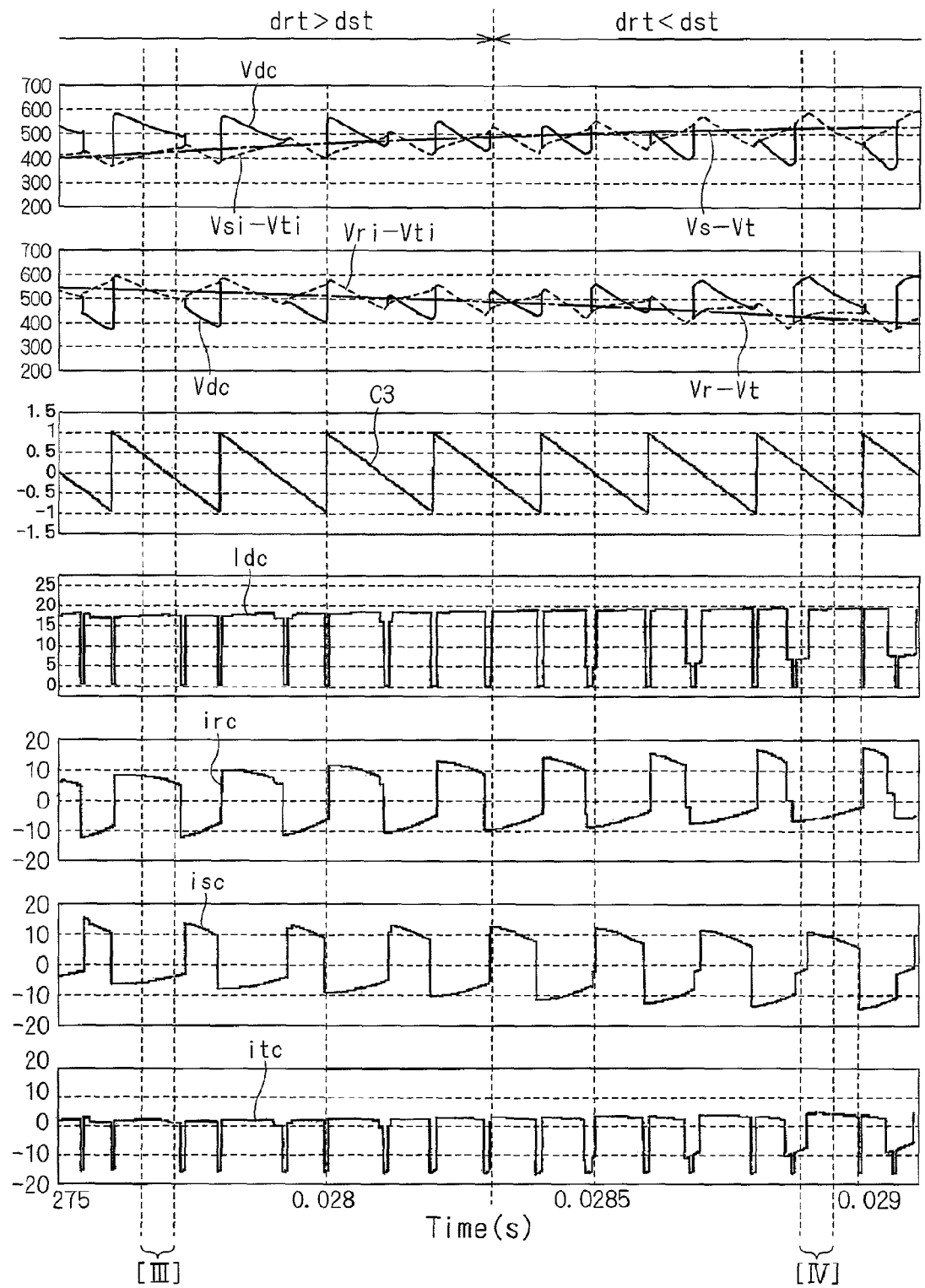
FIG. 19 is a graph showing an operation of the direct AC-AC power converter in a case where a saw-tooth wave is used as a carrier.

FIG. 19 is a graph showing an operation of the direct AC-AC power converter in the case where the saw-tooth wave is used as a carrier. Also in FIG. 19, shown are the first to seventh-stage graphs, like in FIG. 18.

In the left side of each graph, the AC voltages Vr and Vs correspond to the maximum phase and the intermediate phase, respectively, and the relation drt>dst holds on the conduction ratios, and this corresponds to the case shown in FIG. 17. In the right side of each graph, the AC voltages Vr and Vs correspond to the intermediate phase and the maximum phase, respectively, and the relation drt<dst holds on the conduction ratios.

In the period where drt>dst, shown is a case where the voltage source inverter 2 adopts the unit voltage vectors V7, V6, V4, and V0 in this order in the first period drt·T0 as shown in FIG. 17. In the right side of each graph, shown is a case where the voltage source inverter 2 adopts the unit voltage vectors V0, V4, V6, and V7 in this order in the second period dst·T0.

Among two broken lines representing timing group [III], the leftmost broken line indicates the midpoint of the first section in which the unit voltage vector V6 is adopted and the rightmost broken line indicates the midpoint of the second section in which the unit voltage vector V4 is adopted.

Among two broken lines representing timing group [IV], the leftmost broken line indicates the midpoint of the first section in which the unit voltage vector V4 is adopted and the rightmost broken line indicates the midpoint of the second section in which the unit voltage vector V6 is adopted.

In the case where the saw-tooth wave is adopted as the carrier C4 of the voltage source inverter 2, as shown in FIG. 17, the arrangement of the adopted unit voltage vectors becomes asymmetry in the first period. Therefore, an error is apt to exist in the result of the interpolation using the link voltage Vdc measured in the first section and the second section for the upper envelope voltage E1 of the link voltage Vdc. Especially in a case where the respective lengths of the first section and the second section are about maximum values, an error voltage becomes maximum.

Assuming that the amplitude of the link current Idc is Imax and the time ratio in a period in which the link current Idc flows from the current source converter 1 is D, the current flowing from any one of the capacitors Cr, Cs, and Ct constituting the filter 6 is Imax·(1−D). Therefore, assuming that the electrostatic capacitance of each of the capacitors Cr, Cs, and Ct is C, the amplitude Vr of the ripple voltage of the link voltage Vdc is represented as Vr=(1/C)·Imax·(1−D)·D·T0, and when D=0.5, the amplitude Vr of the ripple voltage becomes maximum.

FIG. 19 shows a case where Imax=20 A, C=10 µF, and T0=200 µs, and the maximum value of Vr is 100V. The error voltage is expected to be Vr/2=50V because of the interpolation. In this exemplary case, the error voltage reaches about 10% of the absolute values of the AC voltages Vr, Vs, and Vt.

Thus, in the case where the saw-tooth wave is adopted as the carrier C4 of the voltage source inverter 2, the value obtained by the interpolation of the first measured value Vmax1 and the second measured value Vmax2 obtained by measurement in the first section and the second section, respectively, can generate an error between the value and the upper envelope voltage E1 of the link voltage Vdc.

In order to reduce the error, it is necessary to reduce the amplitude Vr of the above-discussed ripple voltage. For example, the cycle T0 is set shorter, and in other words, the carrier frequency is set higher. Alternatively, for example, the electrostatic capacitance of the capacitors Cr, Cs, and Ct is set larger.

Further, in a control system of the voltage source inverter 2, by adopting a so-called current minor loop, it is possible to reduce the effect of the ripple voltage generated in the link voltage.

Figure 20:
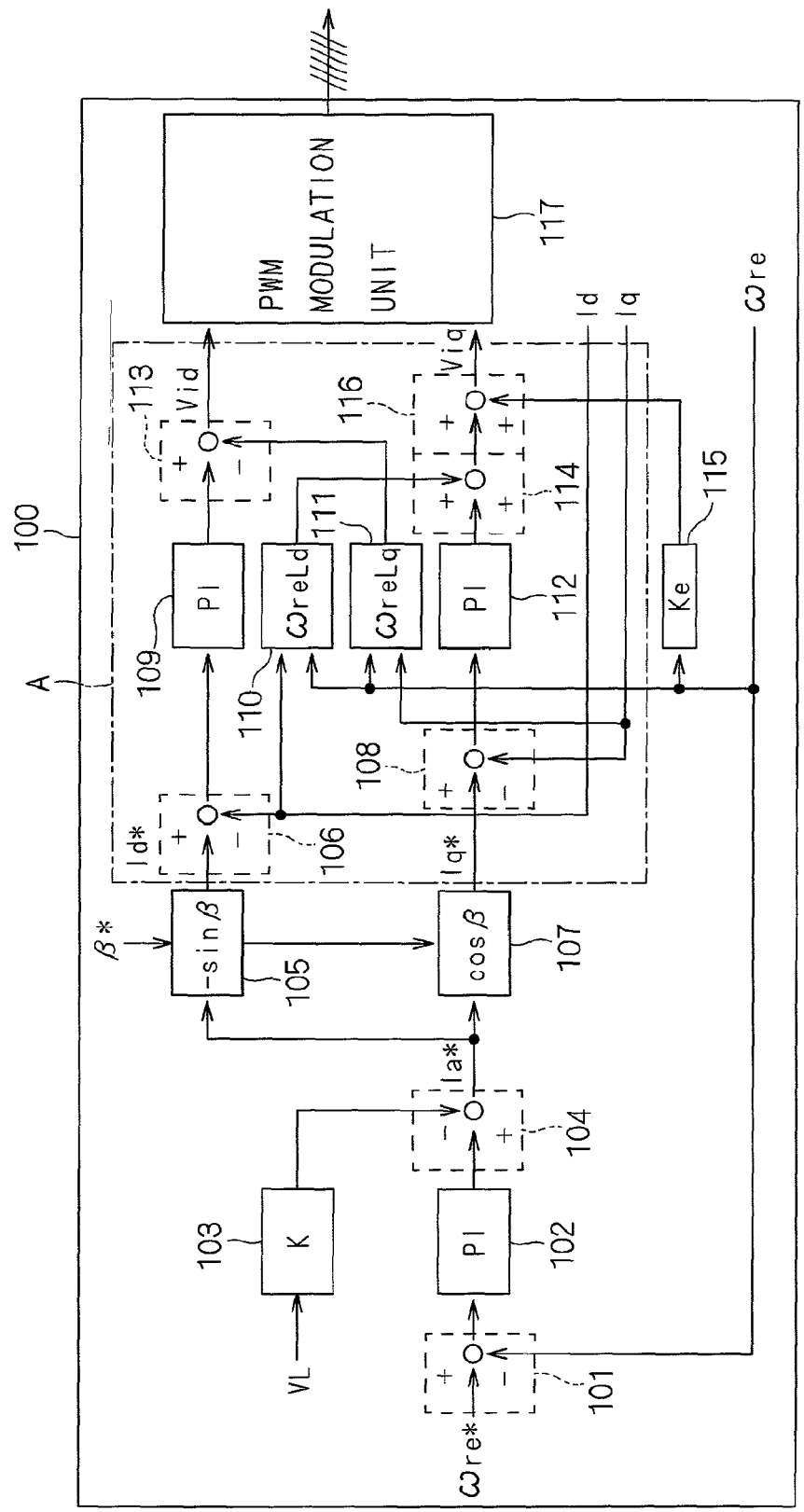
FIG. 20 is a block diagram showing a control unit for controlling switching of a voltage source inverter.

FIG. 20 shows a control unit 100 for controlling the switching of the voltage source inverter, which is shown in Japanese Patent Publication No. 4067021. A configuration of the so-called current minor loop is represented by the reference sign A.

The control unit 100 has an adder-subtracter 101, a PI controller 102, a multiplier 103, an adder-subtracter 104, a conversion unit 105, adder-subtracters 106, 108, 113, 114, and 116, a conversion unit 107, PI controllers 109 and 112, multiplication units 110 and 111, a multiplier 115, and a PWM modulation unit 117.

The adder-subtracter 101 subtracts a rotation angular velocity core from a rotation angular velocity target value core*, to thereby output a difference signal. The PI controller 102 performs PI control on the basis of the difference signal outputted from the adder-subtracter 101. The multiplier 103 multiplies the voltage VL across both ends of the inductor (not shown) by a gain K. The adder-subtracter 104 subtracts the output of the multiplier 103 from the signal from the PI controller 102, to thereby output a current target value Ia*. The conversion unit 105 multiplies the current target value Ia* outputted from the adder-subtracter 104 by −sin β* (β*: current phase target value), to thereby output a d-axis current target value Id*. The adder-subtracter 106 subtracts a d-axis current value Id from the d-axis current target value Id* outputted from the conversion unit 105. The conversion unit 107 multiplies the current target value Ia* outputted from the adder-subtracter 104 by cos β* (β*: current phase target value), to thereby output a q-axis current target value Iq*. The adder-subtracter 108 subtracts a q-axis current value Iq from the q-axis current target value Iq* outputted from the conversion unit 107. The PI controller 109 performs PI control on the basis of the signal from the adder-subtracter 106. The multiplication unit 110 multiplies the d-axis current value Id by ωre·Ld (Ld: d-axis inductance of the motor). The multiplication unit 111 multiplies q-axis current value Iq by ωre·Lq (Ld: q-axis inductance of the motor). The PI controller 112 performs PI control on the basis of the signal from the adder-subtracter 108. The adder-subtracter 113 subtracts the signal from the multiplication unit 111 from the signal from the PI controller 109, to thereby output a d-axis voltage Vid. The adder-subtracter 114 adds the signal from the multiplication unit 110 to the signal from the PI controller 112. The multiplier 115 multiplies the rotation angular velocity core by an inductive voltage coefficient Ke. The adder-subtracter 116 adds the signal from the multiplier 115 to the signal from the adder-subtracter 114, to thereby output a q-axis voltage Viq. The PWM modulation unit 117 outputs a PWM control signal for switching of an inverter on the basis of the d-axis voltage Vid outputted from the adder-subtracter 113 and the q-axis voltage Viq outputted from the adder-subtracter 116.

The current minor loop A has the adder-subtracters 106, 108, 113, 114, and 116 and the PI controllers 109 and 112, and the multiplication units 110 and 111, and inputs the d-axis current target value Id* and the q-axis current target value Iq* and outputs the d-axis voltage Vid and the q-axis voltage Viq. It is preferable to adopt the current minor loop A, in terms of non-interference between the d-axis and the q-axis and linearization of the load.

In the control unit 100, when the modulation factor is obtained in the PWM modulation unit 117, the link voltage Vdc has an effect on the modulation factor. In other words, the link voltage Vdc is a disturbance of the current minor loop A.

As well known, however, it is possible to reduce the effect of the disturbance on controlled variables by setting a control gain higher. Therefore, by increasing the control gain of the current minor loop A, it is possible to reduce the effect of the link voltage Vdc on the current minor loop A.

Herein, though the disturbance cannot be suppressed in the current minor loop A in a range not less than ½ of the carrier frequency, since the error voltage varies depending on the switching pattern of the inverter, a low-frequency component of the disturbance can be mainly reduced.

Thus, in the case where the saw-tooth wave is used for the carrier, though the error increases as compared with the case where the symmetric triangular wave is used for the carrier, the error can be reduced by increasing the carrier frequency or/and increasing the electrostatic capacitance of the capacitors Cr, Cs, and Ct. Further, in the case where the symmetric triangular wave is used for the carrier, the interpolation is achieved by obtaining the arithmetic mean. Thus, since no complicated averaging is performed on the measured link voltage, the above-discussed preferred embodiment can achieve excellent responsiveness in the measurement of the link voltage.

While the invention has been shown and described in detail, the foregoing description is in all aspects illustrative and not restrictive. It is therefore understood that numerous modifications and variations can be devised without departing from the scope of the invention.

The invention claimed is:

1. A method of measuring a link voltage, performed in a direct AC-AC power converter circuit including:
    a DC link;
    a current source converter having three input terminals for receiving three-phase AC voltages by phase, and commutating current supplied from said input terminals at a cycle which is divided into a first period and a second period to apply a link voltage which is a DC voltage to said DC link; and
    a voltage source inverter for performing switching on said link voltage with a switching pattern based on pulse width modulation to output multiphase alternating current,
    said first period being a period in which said DC link is supplied with current flowing into a first pair out of said three input terminals, to which a voltage of maximum phase and a voltage of minimum phase among said three-phase AC voltages are applied, and
    said second period being a period in which said DC link is supplied with current flowing into a second pair out of said three input terminals, to which a voltage of intermediate phase and said voltage of said minimum phase among said three-phase AC voltages are applied,
    said method comprising the steps of:
    (a) measuring a first measured value which is said link voltage measured at a midpoint of a first section in which only a first said switching pattern is adopted for the longest time in said first period;
    (b) measuring a second measured value which is said link voltage measured at a midpoint of a second section in which only a single said switching pattern is adopted for a time as long as said first section or for the second longest time next to said first section in said first period; and
    (c) obtaining a representative value of said link voltage in one said cycle including said first period by interpolation of said first measured value and said second measured value.

2. The method of measuring a link voltage according to claim 1, wherein said first period is longer than said second period.

3. The method of measuring a link voltage according to claim 2, further comprising the step of:
    (d) adopting said first measured value as said representative value of said link voltage in said cycle including said first period, instead of said steps (b) and (c), in a case where a section in which only a second said switching pattern different from said first said switching pattern is adopted is provided both before and after said first section.

4. The method of measuring a link voltage according to claim 3, wherein
    assuming that a phase for a cycle of said three-phase AC voltages at a point in time when two voltages out of said three-phase AC voltages are equal to each other is π/3, a maximum value of said link voltage is obtained by dividing said representative value of said link voltage in a section in which said phase ranges from −π/6 to π/6 by a cosine value of said phase.

5. The method of measuring a link voltage according to claim 2, wherein
    said switching pattern is determined on the basis of a result of comparison between a carrier having a triangular wave whose inclinations have the same absolute value and a signal wave taking a constant value in said first period, and
    when said switching pattern adopted in said first section and said switching pattern adopted in said second section are identical to each other, an arithmetic mean is adopted as said interpolation in said step (c).

6. The method of measuring a link voltage according to claim 5, wherein
    a timing for measuring said first measured value and a timing for measuring said second measured value are determined by a timing at which said carrier takes a single predetermined value.

7. The method of measuring a link voltage according to claim 6, wherein
assuming that a phase for a cycle of said three-phase AC voltages at a point in time when two voltages out of said three-phase AC voltages are equal to each other is $\pi/3$, a maximum value of said link voltage is obtained by dividing said representative value of said link voltage in a section in which said phase ranges from $-\pi/6$ to $\pi/6$ by a cosine value of said phase.

8. The method of measuring a link voltage according to claim 5, wherein
assuming that a phase for a cycle of said three-phase AC voltages at a point in time when two voltages out of said three-phase AC voltages are equal to each other is $\pi/3$, a maximum value of said link voltage is obtained by dividing said representative value of said link voltage in a section in which said phase ranges from $-\pi/6$ to $\pi/6$ by a cosine value of said phase.

9. The method of measuring a link voltage according to claim 2, wherein
assuming that a phase for a cycle of said three-phase AC voltages at a point in time when two voltages out of said three-phase AC voltages are equal to each other is $\pi/3$, a maximum value of said link voltage is obtained by dividing said representative value of said link voltage in a section in which said phase ranges from $-\pi/6$ to $\pi/6$ by a cosine value of said phase.

10. The method of measuring a link voltage according to claim 1, further comprising the step of:
(d) adopting said first measured value as said representative value of said link voltage in said cycle including said first period, instead of said steps (b) and (c), in a case where a section in which only a second said switching pattern different from said first said switching pattern is adopted is provided both before and after said first section.

11. The method of measuring a link voltage according to claim 10, wherein assuming that a phase for a cycle of said three-phase AC voltages at a point in time when two voltages out of said three-phase AC voltages are equal to each other is $\pi/3$, a maximum value of said link voltage is obtained by dividing said representative value of said link voltage in a section in which said phase ranges from $-\pi/6$ to $\pi/6$ by a cosine value of said phase.

12. The method of measuring a link voltage according to claim 1, wherein
said switching pattern is determined on the basis of a result of comparison between a carrier having a triangular wave whose inclinations have the same absolute value and a signal wave taking a constant value in said first period, and
when said switching pattern adopted in said first section and said switching pattern adopted in said second section are identical to each other, an arithmetic mean is adopted as said interpolation in said step (c).

13. The method of measuring a link voltage according to claim 12, wherein
a timing for measuring said first measured value and a timing for measuring said second measured value are determined by a timing at which said carrier takes a single predetermined value.

14. The method of measuring a link voltage according to claim 13, wherein
assuming that a phase for a cycle of said three-phase AC voltages at a point in time when two voltages out of said three-phase AC voltages are equal to each other is $\pi/3$, a maximum value of said link voltage is obtained by dividing said representative value of said link voltage in a section in which said phase ranges from $-\pi/6$ to $\pi/6$ by a cosine value of said phase.

15. The method of measuring a link voltage according to claim 12, wherein
assuming that a phase for a cycle of said three-phase AC voltages at a point in time when two voltages out of said three-phase AC voltages are equal to each other is $\pi/3$, a maximum value of said link voltage is obtained by dividing said representative value of said link voltage in a section in which said phase ranges from $-\pi/6$ to $\pi/6$ by a cosine value of said phase.

16. The method of measuring a link voltage according to claim 1, wherein
assuming that a phase for a cycle of said three-phase AC voltages at a point in time when two voltages out of said three-phase AC voltages are equal to each other is $\pi/3$, a maximum value of said link voltage is obtained by dividing said representative value of said link voltage in a section in which said phase ranges from $-\pi/6$ to $\pi/6$ by a cosine value of said phase.

* * * * *